(12) United States Patent
Inoue et al.

(10) Patent No.: US 7,602,002 B2
(45) Date of Patent: Oct. 13, 2009

(54) SEMICONDUCTOR DEVICE WITH DRAM PORTION HAVING CAPACITOR-OVER-BIT-LINE STRUCTURE AND LOGIC PORTION

(75) Inventors: Tomoko Inoue, Kanagawa (JP); Ken Inoue, Kanagawa (JP)

(73) Assignee: NEC Electronics Corporation, Kanagawa (JP)

( * ) Notice: Subject to any disclaimer, the term of this patent is extended or adjusted under 35 U.S.C. 154(b) by 0 days.

(21) Appl. No.: 11/347,370

(22) Filed: Feb. 6, 2006

(65) Prior Publication Data

US 2006/0192236 A1 Aug. 31, 2006

Related U.S. Application Data

(63) Continuation-in-part of application No. 10/876,548, filed on Jun. 28, 2004, now Pat. No. 7,105,882.

(30) Foreign Application Priority Data

Jun. 30, 2003 (JP) ............................ 2003-187496
Feb. 18, 2004 (JP) ............................ 2004-041280

(51) Int. Cl.
*H01L 27/108* (2006.01)

(52) U.S. Cl. ................. 257/309; 257/311; 257/E27.088

(58) Field of Classification Search ................. 257/296, 257/298, 306–309, 311, E27.088, E27.097
See application file for complete search history.

(56) References Cited

U.S. PATENT DOCUMENTS

| | | | | |
|---|---|---|---|---|
| 6,130,449 A | * | 10/2000 | Matsuoka et al. | ............ 257/296 |
| 6,150,689 A | * | 11/2000 | Narui et al. | .................. 257/306 |
| 6,258,649 B1 | * | 7/2001 | Nakamura et al. | .......... 438/238 |
| 6,737,694 B2 | * | 5/2004 | Kim et al. | .................... 257/296 |
| 6,965,139 B2 | * | 11/2005 | Ohno | ......................... 257/296 |

FOREIGN PATENT DOCUMENTS

| | | |
|---|---|---|
| JP | 2002-231906 | 8/2002 |
| JP | 2003-7854 | 1/2003 |

* cited by examiner

*Primary Examiner*—Marcos D. Pizarro
(74) *Attorney, Agent, or Firm*—Young & Thompson

(57) ABSTRACT

The present invention provides a semiconductor device comprising: a semiconductor substrate having a DRAM portion and a Logic portion; a first transistor in said DRAM portion; a second transistor in said Logic portion; a first insulating layer covering said DRAM portion and said Logic portion; a first contact plug formed in said first insulating layer in electrically contact with said first transistor in said DRAM portion; a first bit line for said DRAM portion formed on said first insulating layer in electrically contact with said first contact plug; a nitride film formed in contact with said first insulating layer to cover said DRAM portion and said Logic portion, wherein said first bit line locating between said first insulating layer and said nitride film.

4 Claims, 21 Drawing Sheets

TRANSISTOR FOR MEMORY CELL

FIG. 20　　PRIOR ART
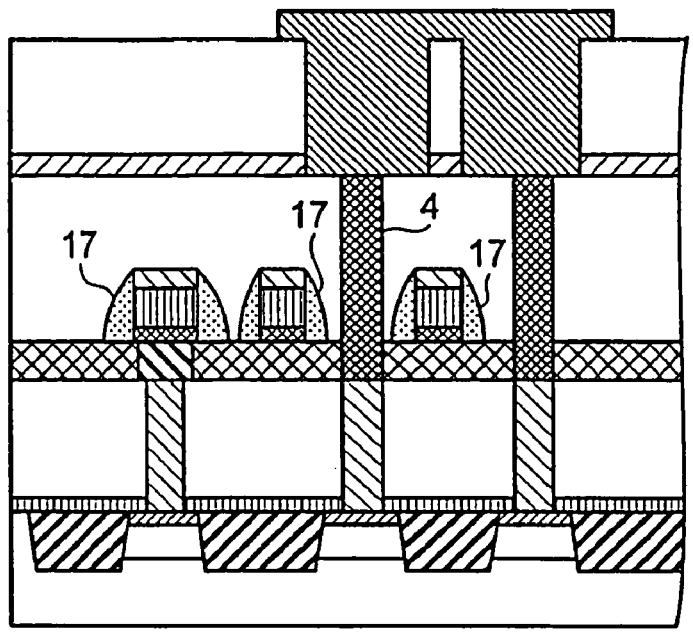
FIG. 21　　　　　　　　　　PRIOR ART
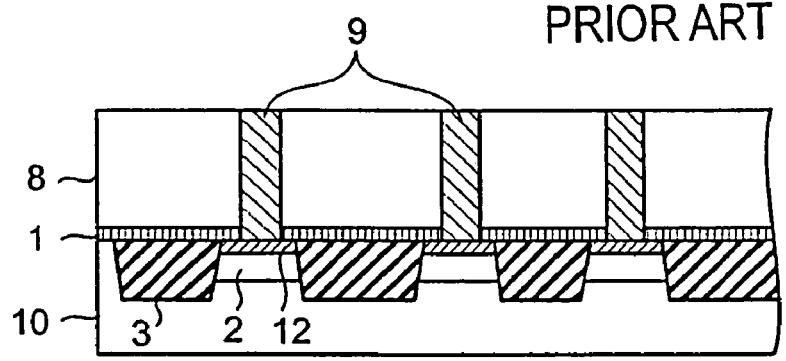
FIG. 22　　PRIOR ART
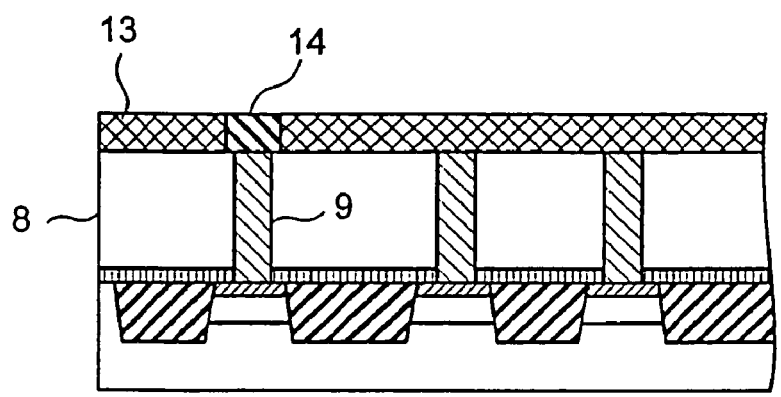

PRIOR ART

SEMICONDUCTOR DEVICE WITH DRAM PORTION HAVING CAPACITOR-OVER-BIT-LINE STRUCTURE AND LOGIC PORTION

This application is a continuation-in-part application of patent application Ser. No. 10/876,548 filed on Jun. 28, 2004, which claims priority of Japanese patent application NOs. 2003-187496 and 2004-041280. The entire contents of these applications are hereby incorporated by references.

BACKGROUND OF THE INVENTION

1. Field of the Invention

The present invention relates to a semiconductor device.

2. Description of Related Art

A memory cell composing DRAM generally composed of a transistor for the memory cell and a capacitance element. Capacitor over bit line (COB) DRAM having a structure, in which a capacitance element of DRAM is disposed above a bit line, is proposed for achieving higher degree of integration of the memory cell. Typical conventional structure of such COB DRAM is shown in FIG. 18.

In this type of the conventional DRAM, a MOS transistor formed on a semiconductor substrate such as a silicon substrate 10 or the like functions as a transistor for memory cell. A bit line 6 is formed on an upper layer of the transistor for the memory cell via a cell contact interlayer film 8, and a capacitance element 11 is formed on an upper layer of the bit line 6 via a capacitance contact interlayer film 7. The bit line 6 is coupled to a transistor for memory cell formed on the silicon substrate 10 by being coupled through a barrier metal layer 5 to a cell contact 9, and the capacitance element 11 is coupled to the transistor for memory cell formed on the silicon substrate 10 through the capacitance contact 4 and the cell contact 9.

Although FIG. 18 illustrates the barrier metal layer 5 provided as an underlying layer disposed under the bit line 6, it is intended to additionally include the barrier metal layer 5 when the term "bit line 6" appears in the following description.

In such structure, it is designed to include a configuration of maintaining a predetermined spacing between the bit line 6 and the capacitance contact 4 or the cell contact 9, in order to inhibit a generation of electric short circuit. However, the progresses in increasing the level of the integration in the semiconductor devices necessarily reduce the room for the spacing between the bit line 6 and the cell contact 9 or the capacitance contact 4, a short circuit may be occurred between the bit line 6 and the cell contact 9 or the capacitance contact 4 by a misalignment caused in the formation of the bit line 6 or a misalignment caused in the formation of the capacitance contact 4 or the like. When the short circuit is occurred between the bit line 6 and the cell contact 9 or the capacitance contact 4 as described above, failure occurs in the resultant memory cell, thereby reducing the yield of DRAM.

Thus, a semiconductor device additionally including a bit contact interlayer film 13 formed on the cell contact interlayer film 8 is proposed, in order to inhibit the short circuit between the bit line 6 and the cell contact 9. The constitution of such conventional semiconductor device is shown in FIG. 19. In this type of conventional semiconductor device, a bit contact interlayer film 13 is formed after forming the cell contact interlayer film 8, and a bit contact 14 is formed on a portion of the bit contact interlayer film 13 in order to couple the cell contact 9 to the bit line 6. Having such structure, larger room for the spacing for preventing the short circuit between the upper end of the cell contact 9 and the bit line 6 can be acquired. However, sufficient level of inhibition for the short circuit between the bit line 6 and the capacitance contact 4 can not be obtainable by employing such structure.

A semiconductor device having a configuration for inhibiting the short circuit between the capacitance contact 4 and the bit line 6 includes, as shown in FIG. 20, a self-aligned (or self-alignment) contact structure comprising a side wall 17 formed on a material such as silicon nitride film or the like having an etch selectivity against the capacitance contact interlayer film 4 on the side surface of the bit line 6 is proposed (see, for example, JP-A-2002-231,906 and JP-A-2003-7,854). The self alignment contact structure (hereinafter abbreviated as SAC) is a structure, in which circumferences of the bit line 6 are covered with an insulating film such as nitride film or the like to provide an inhibition to the short circuit between the bit line 6 and the capacitance contact 4.

In the manufacture of the semiconductor device having the SAC structure, contact holes are formed in a self-alignment manner by employing an etch mask pattern having a size that is larger than the actual size of the contact hole, and by employing the side wall 17 of the silicon nitride film as an etch stop, which is provided on the side surface of the bit line 6. Having such configuration, the short circuit between the bit line 6 and the capacitance contact 4 can be inhibited when the capacitance contact 4 is misaligned.

Next, a method for manufacturing a semiconductor device having the SAC structure will be described below in reference to FIG. 21 to FIG. 27.

First of all, as shown in FIG. 21, shallow grooves are formed on a silicon substrate 10, similarly as in the typical manufacturing process for DRAM, and the grooves are filled with an insulating material to form element isolation insulating films 3, so that the memory cell region is sectioned into individual cell regions. Then, an impurity is diffused into the silicon substrate 10 to form source drain regions 2, thereby forming a MOS transistor, which will be transistors for the memory cells.

Next, cobalt silicide layers 12 are formed by silicidating the entire surfaces of the diffusion layers and the gates of respective transistors with cobalt. Thereafter, silicon nitride films 1 are formed on the surface of the silicon substrate 10 including the surface of element isolation insulating films 3 to coat the respective transistors.

Next, cell contact interlayer films 8 are formed by using a material such as silicon oxide film or the like so as to cover the respective transistors for memory cells in the memory cell region. Then, contact holes for coupling the bit line and the capacitance element to the transistors for memory cells in the cell contact interlayer films 8 are formed via a selective etch process. Then, tungsten (W) is deposited on the entire surfaces thereof via a chemical vapor deposition (CVD) until the contact holes are filled therewith. Thereafter, the surfaces of the cell contact interlayer films 8 are planarized via a chemical mechanical polishing (CMP) so as to leave W only in respective contact holes, thereby forming cell contacts 9. A cross sectional view of the semiconductor device after the steps so far is finished is shown in FIG. 21.

Next, as shown in FIG. 22, a bit contact interlayer film 13 comprising silicon oxide is formed to a predetermined thickness on the surfaces of the cell contact interlayer films 8 that include exposed surfaces of the cell contact 9 to coat the surfaces of the cell contacts 9. Then, the bit contact interlayer film 13 is etched so that only the positions directly above the portions electrically coupled to the bit lines 6 are selectively etched among the cell contacts 9 to form contact holes, thereby exposing the upper surface of the cell contacts 9.

Then, W is deposited via CVD until the formed contact holes are filled therewith, similarly as in the formation process of the cell contacts 9, and the surfaces thereof are planarized via CMP so as to leave W only in respective contact holes, thereby forming bit contacts 14 for coupling to the bit lines 6. A cross sectional view of the semiconductor device after the steps so far is finished is shown in FIG. 22.

Next, as shown in FIG. 23, titanium nitride (TiN) for forming barrier metal layers 5 and tungsten (W) for forming bit lines 6 are deposited on the surfaces of the bit contact interlayer film 13, and multi-layered films comprising a silicon oxide film and a silicon nitride film are formed thereon as hard mask films 15. Then, the hard mask films 15, bit lines 6 and barrier metal layers 5 are patterned to form a bit-line pattern by employing a photo resist (not shown.) A cross sectional view of the semiconductor device after the steps so far is finished is shown in FIG. 23.

Next, as shown in FIG. 24, s silicon nitride film 16 is grown to a predetermined thickness on the entire surfaces to cover the hard mask films 15 and the bit lines 6.

Next, as shown in FIG. 25, the silicon nitride film 16 is etched back by conducting an anisotropic etch process so as to leave the silicon nitride film only on the side surfaces of the bit lines 6 and the barrier metal layers 5, thereby forming side walls 17.

Next, as shown in FIG. 26, silicon oxide films are formed to cover the bit lines 6, thereby forming capacitance contact interlayer films 7. Then, the capacitance contact interlayer films 7 are etched so that only the positions directly above the portions electrically coupled to capacitance elements 11 are selectively etched among the cell contacts 9 to form contact holes.

In this configuration, even if misalignments of the contact holes occur in the formation process thereof to cause the contact holes overlapping with the bit lines 6, unwanted etch of the side walls 17 is avoided, because the side walls 17 formed on the side surfaces of the bit lines 6 comprise the silicon nitride film, the etch ratio of which to the silicon oxide film contained in the capacitance contact interlayer film 7 is much higher. The exposure of the bit lines 6 in the contact hole is also avoided because the formed contact holes are self-aligned.

Then, similarly as in the formation process for the cell contacts 9 or the bit contacts 14, W is deposited via CVD until the contact holes are filled therewith, and the surfaces thereof are planarized via CMP so as to leave W only in respective contact holes, thereby forming capacitance contacts 4 for coupling to the capacitance elements 11. A cross sectional view of the semiconductor device after the steps so far is finished is shown in FIG. 26.

Then, the capacitance element 11 for coupling to the capacitance contact 4 is finally formed to complete the semiconductor device. A cross sectional view of the semiconductor device after the steps so far is finished is shown in FIG. 27.

The microscopic contact holes can be formed without causing a short-circuit to the bit line 6 by employing the SAC structure described above. However, when the SAC structure described above is employed, the manufacturing process additionally requires the process steps such as a step for forming hard mask film 15 on the bit line 6, a step for depositing a nitride film for forming the side wall 17, a step for etching back the side wall 17 or the like, thereby increasing the number of the processing steps in the manufacturing process.

The SAC structure is characterized in that nitride films are disposed on both of the upper part and the side wall part of an interconnect such as bit line 6 or the like, and therefore this configuration provides an advantageous effect of inhibiting the short circuit even if a misalignment occurs during the formation of the contact holes (capacitance contacts) between interconnects or even if a layout of intentionally disposing the contact holes in the region of upper part of the interconnect is employed.

In order to form such SAC structure, it is necessary to employ an etch condition including higher selective etch ratio of the oxide film of the capacitance contact interlayer film 7 to the nitride film existing in the upper part and the side walls of the interconnect such as bit line 6 or the like, when the contact hole for the capacitance contact 4 is processed. In addition, it is also necessary to employ the nitride film having better film quality. Since the deposition process at an elevated temperature is often required for depositing the nitride film having better film quality, the logic transistor having higher performance is often deteriorated. Consequently, when the memory cell regions and other types of circuits are formed on the same semiconductor substrate, such as a combined logic/DRAM device, it is difficult to obtain the nitride film having better film quality.

In addition, the SAC structure employs a hard mask of $SiO_2$/SiN films or SiN film instead of resist mask during the etch process for the interconnects such as the bit lines 5 or the like. This provides a thicker nitride film formed on the upper part of the interconnect, thereby providing higher height of the interconnects such as the bit lines 5 or the like. As such, a higher aspect ratio of a line and space (L/S) portion of the interconnect (bit line) is obtainable in the process for forming the nitride film after etching the interconnects (process for forming the side walls 17 of the interconnects) and in the process for forming the capacitance contact interlayer film 7 after forming the side wall 17, and thus it is difficult to sufficiently achieve the better filling process.

Further, thicker nitride films for forming the side walls 17 are necessary to be formed, in order to leave thicker nitride films on the side wall portions of the interconnect such as the bit line 6 or the like in the SAC structure. However, the progressing miniaturization of the device reduces the size of the L/S portion to cause a conjunction between the interconnects, such that it becomes difficult to form thicker interconnect.

In addition, thicker nitride film formed on the interconnect provide thicker contact interlayer film in the SAC process, and thus it is disadvantageous for the miniaturization. This is due to the difficulties in the ability to etch thereof or in the ability to fill the contacts (with barrier metal, W or the like), rather than the problem of the resistance of the resist. Larger thickness of the contact interlayer film provides higher contact resistance.

Since the conventional method for manufacturing the semiconductor device described above employs the SAC configuration, in which the hard mask film is provided on the upper portion of the interconnect such as bit line and the side wall comprising the nitride film is formed on the side surface thereof, there have been rooms for providing improvements on the following points:

(1) Additional process steps of: depositing a hard mask film on the bit line; depositing a nitride film to form side walls; etching back the side wall, or the like, are required, thereby increasing the number of the steps of the manufacturing process, (2) Since the material having higher selective etch ratio should be selected by employing the nitride film having better film quality, which requires the deposition process at an elevated temperature, it is difficult to apply the SAC structure to the combined logic/DRAM device comprising the transistor having higher performance, which tends to be deteriorated at an elevated temperature.

(3) Since the hard mask film should be formed on the bit line, the height of the bit line is necessarily higher, and the progressing miniaturization causes difficulties in the process for filling the spaces between bit lines with interlayer films or in the process for composing the nitride films on the side walls of the bit lines.

SUMMARY OF THE INVENTION

It is an object of the present invention to stably provide a semiconductor device having higher reliability.

In order to achieve an above-described object, there is provided a method for manufacturing a semiconductor device, which comprises a transistor formed on a semiconductor substrate and a capacitance element disposed on the transistor, the capacitance element being coupled to the transistor, comprising: forming a transistor on a semiconductor substrate; forming a first interlayer insulating film to cover the transistor; forming a plurality of first electroconducting plugs within the first interlayer insulating film, the first electroconducting plug being coupled to the transistor; forming a second interlayer insulating film on the first interlayer insulating film to cover the first electroconducting plug; forming a second electroconducting plug within the second interlayer insulating film, the second electroconducting plug being coupled to the first electroconducting plug; forming a bit line on the second interlayer insulating film, the bit line being coupled to the second electroconducting plug; etching a part covering the first electroconducting plug in the second interlayer insulating film off; forming a nitride film to cover a side surface and an upper surface of the bit line; forming a third interlayer insulating film to cover the nitride film; forming a third electroconducting plug within the third interlayer insulating film and the nitride film, the third electroconducting plug being coupled to a first electroconducting plug, which is not coupled to the second electroconducting plug; and forming a capacitance element on the third interlayer insulating film, the capacitance element being coupled to the third electroconducting plug.

Since the nitride film is formed to cover the upper and the side surfaces of the bit lines according to the present invention, the short circuit between the bit line and the capacitance contact can be inhibited without employing SAC process, so that the number of the manufacturing process steps is reduced and the miniaturization thereof is achieved. In addition, the configuration according to the present invention reduces the need for employing the nitride film having better film quality, and therefore the configuration can be applicable to the combined logic/DRAM device comprising the transistor having higher performance, which tends to be deteriorated at an elevated temperature.

Further, the method for manufacturing the semiconductor device according to the present invention may have another configuration, in which the bit line may be formed directly on the cell contact interlayer film without forming a bit contact interlayer film and a bit contact.

According to another aspect of the present invention, there is provided a method for manufacturing a semiconductor device, which comprises a transistor formed on a semiconductor substrate and a capacitance element disposed on the transistor, the capacitance element being coupled to the transistor, comprising: forming a transistor on a semiconductor substrate; forming a first interlayer insulating film to cover the transistor; forming a first electroconducting plug within the first interlayer insulating film, the first electroconducting plug being coupled to the transistor; forming a second interlayer insulating film on the first interlayer insulating film to cover the first electroconducting plug; forming a second electroconducting plug within the second interlayer insulating film, the second electroconducting plug being coupled to the first electroconducting plug; forming a barrier metal film on the second interlayer insulating film, the barrier metal film being coupled to the second electroconducting plug; forming a bit line on the barrier metal film; selectively etching the barrier metal film to form an inversely-tapered shape; forming a third interlayer insulating film on the second interlayer insulating film to cover the bit line; forming a third electroconducting plug within the third interlayer insulating film and the second interlayer insulating film, the third electroconducting plug being coupled to a first electroconducting plug, which is not coupled to the second electroconducting plug; and forming a capacitance element on the third interlayer insulating film, the capacitance element being coupled to the third electroconducting plug.

According to the above-described aspect of the present invention, wider spacings between the bit line and the cell contact and/or between the bit line and the capacitance contact can be provided by having a configuration including selectively etching the barrier metal film of the bit line to form an inversely-tapered shape, and thus the short circuits between the bit line and the cell contact and/or between the bit line and the capacitance contact can be inhibited.

Further, the method for manufacturing the semiconductor device according to the present invention may have another configuration, in which the barrier metal layer formed on a lower surface of the bit line is selectively etched to form an inversely-tapered shape without forming the bit contact interlayer film and the bit contact, when a type of the semiconductor device comprising a bit line directly formed on the cell contact interlayer film is manufactured.

Since wider spacing between the bit line and the cell contact can be presented by having a configuration including forming the barrier metal film of the bit line to an inversely-tapered shape according to the above-described aspect of the present invention, this configuration reduces the need for having a larger room for the spacing for preventing the short circuit between the bit line and the cell contact by comprising a bit contact interlayer film. Therefore, the process steps for forming the bit contact interlayer film and the bit contact can be reduced, and the bit contact resistance can be reduced.

According to the present invention, a semiconductor device having higher reliability is stably provided.

BRIEF DESCRIPTION OF THE DRAWINGS

FIG. 20 is a cross sectional view of a conventional semiconductor device having the SAC structure.

FIG. 21 is a cross sectional view of a conventional semiconductor device, for describing the method for manufacturing the semiconductor device of SAC structure.

FIG. 22 is a cross sectional view of a conventional semiconductor device, for describing the method for manufacturing the semiconductor device of SAC structure.

DESCRIPTION OF THE PREFERRED EMBODIMENT

Embodiments of the present invention will be described in detail below by referring with the annexed figures.

First Embodiment

Figure 1:
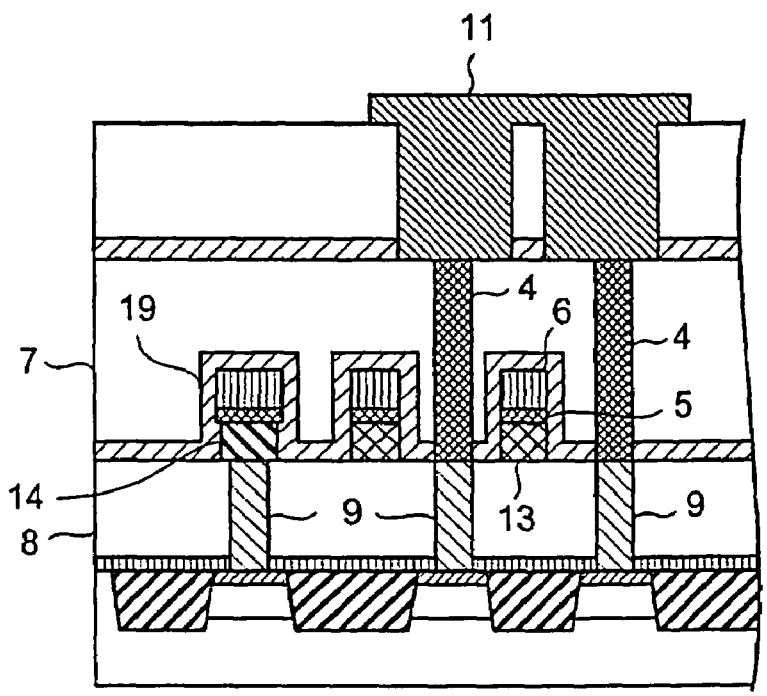
FIG. 1 is a cross sectional view of a semiconductor device manufactured according to a method for manufacturing a semiconductor device of the first embodiment of the present invention.

FIG. 1 is a cross sectional view of a semiconductor device manufactured by a method for manufacturing a semiconductor device according to a first embodiment of the present invention. In FIG. 1, the same numerals are assigned to the same components, which are also shown in FIG. 20, and thus the specific descriptions thereof are not presented.

A semiconductor device in this embodiment is, as shown in FIG. 1, a semiconductor device manufactured by the process, in which the bit contact interlayer film 13 of the conventional semiconductor device which does not have the SAC structure is etched off except the portion where bit line 6 is formed, and then direct nitride film 19 is formed on the entire surface of the top surface and the side surface of the bit line 6 so as to cover the bit line 6 in a same processing step.

Here, the direct nitride film 19 means a nitride film as deposited, which is directly deposited on the bit line 6 without being processed for proceeding to the next process step via any processing steps for the deposited nitride film such as etch back process or the like. In other words, the direct nitride film is a term for distinguishing from the nitride film formed on the side wall in the SAC structure, and the formation method thereof, material thereof or the like are the same as that for the typical nitride film.

Next, the method for manufacturing a semiconductor device of this embodiment will be described with referring to FIG. 2 to FIG. 8.

Figure 2:
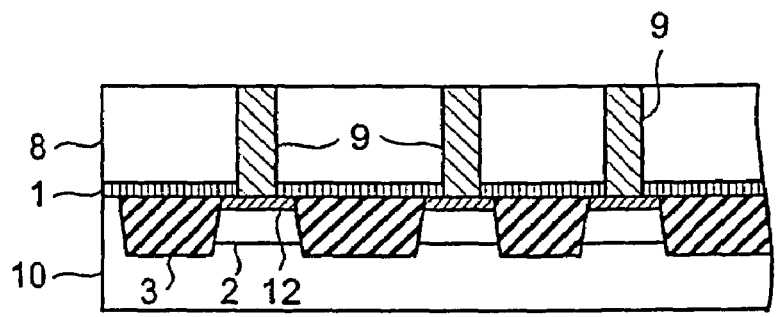
FIG. 2 is a cross sectional view of a semiconductor device for describing the method for manufacturing a semiconductor device of the first embodiment of the present invention.
Figure 3:
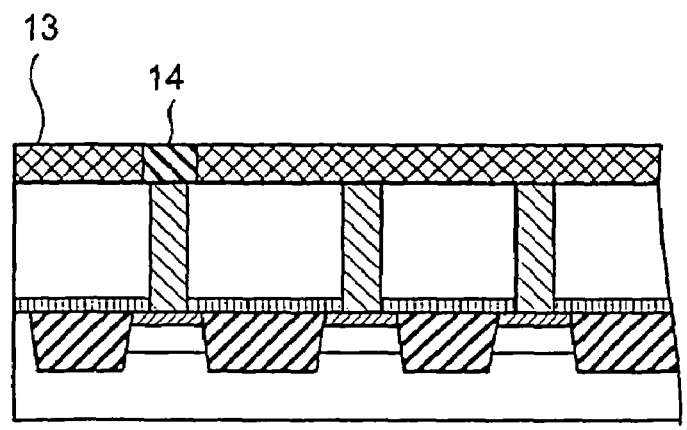
FIG. 3 is a cross sectional view of a semiconductor device for describing the method for manufacturing a semiconductor device of the first embodiment of the present invention.

First of all, as shown in FIG. 2, a transistor for memory cell is formed on the silicon substrate 10 by a method similar to the conventional method, and a cell contact interlayer film 8, and a cell contact 9 are further formed. Then, as shown in FIG. 3, a cell contact interlayer film 13 and a bit contact 14 are formed by a method similar to the conventional method.

Figure 4:
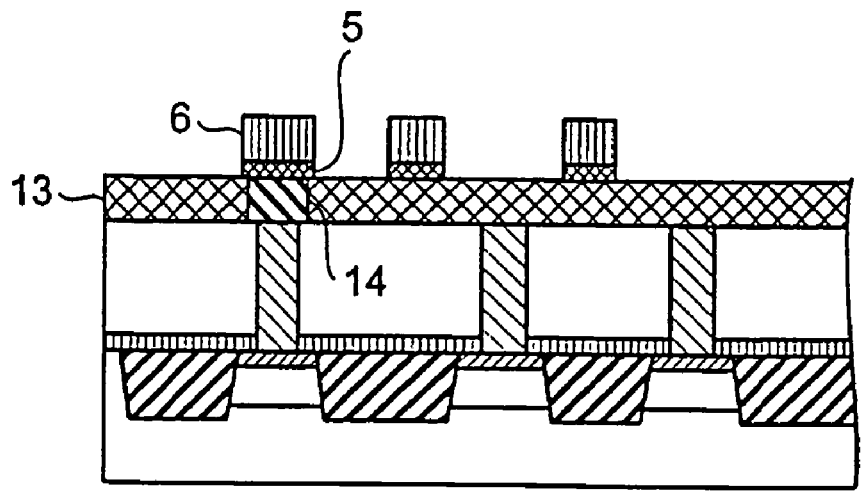
FIG. 4 is a cross sectional view of a semiconductor device for describing the method for manufacturing a semiconductor device of the first embodiment of the present invention.

Next, as shown in FIG. 4, titanium nitride (TiN) for forming barrier metal layers 5 and tungsten (W) for forming bit lines 6 are formed on the surface of the bit contact interlayer film 13. Then, the bit lines 6 and the barrier metal layers 5 are patterned to bit line-shape by using a photo resist (not shown.) A cross sectional view of the semiconductor device after the steps so far is finished is shown in FIG. 3. It should be noted that no hard mask is formed on the upper surface of the bit lines 6.

Figure 5:
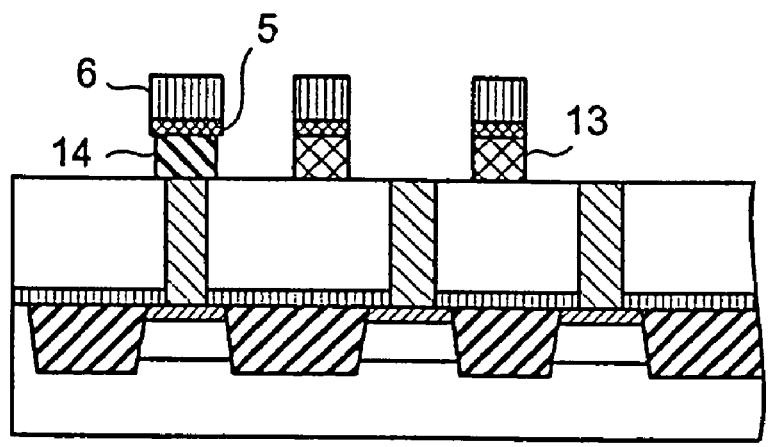
FIG. 5 is a cross sectional view of a semiconductor device for describing the method for manufacturing a semiconductor device of the first embodiment of the present invention.

Next, as shown in FIG. 5, the bit contact interlayer film 13 is partially etched off to create a portion, on which a capacitance contact 4 for electrically coupling a capacitance element 11 formed in the upper layer thereof to a cell contact 9 will be deposited. However, in this embodiment, the entire bit contact interlayer film 13 is etched off except the region where the bit line 6 is formed thereon.

Nevertheless, it is not necessary to etch off the entire bit contact interlayer film 13 except the region where the bit line 6 is formed thereon, and it is sufficient to etch at least only the region of the bit contact interlayer film 13 covering the upper end of the cell contact 9. This is because the region covering the upper end of the cell contact 9 of the bit contact interlayer film 13 (portion directly above the cell contact 9) corresponds to the portion, on which the capacitance contact 4 for electrically coupling the capacitance element 11 formed on the upper layer thereof and the cell contact 9 will be formed.

However, the entire bit contact interlayer film 13 can be etched off except the region where the bit line 6 is formed thereon through the bit line 6 and the barrier metal layer 5 as masks, in order to simplify the manufacturing process.

Here, the reason for having a configuration of partially etching off to create the portion of the bit contact interlayer film 13, on which a capacitance contact 4 for electrically coupling a capacitance element 11 formed in the upper layer thereof to a cell contact 9 will be formed before forming the direct nitride film 19 is described as follows. If the portion of the bit contact interlayer film 13 for forming the capacitance contact 4 is not created before forming the direct nitride film 19, it will be necessary to conduct an etching of triple-layer structure (SiO$_2$/SiN/SiO$_2$) comprising a capacitance contact interlayer film 7, the direct nitride film 19 and the bit contact interlayer film 13 during the step for forming the capacitance contact 4 in the later process. However, when the triple-layer structure (SiO$_2$/SiN/SiO$_2$) is etched, the direct nitride film 19, which comprises an SiN film, is also etched to some level during the step for etching the bit contact interlayer film 13 that includes an SiO$_2$ film, thereby easily causing the short circuit between the capacitance contact 4 and the bit line 6.

Further, in such case, the capacitance contact interlayer film 7 that is SiO$_2$ film as the first level of the triple-layer structure is also etched to increase the hole diameter, thereby easily causing the short circuit between the capacitance contact 4 and the bit line 6.

On the contrary, when the portion of the bit contact interlayer film 13 for forming the capacitance contact 4 is removed before forming the direct nitride film 19, only an etch of the dual layer structure composing of the capacitance contact interlayer film 7 and the direct nitride film 19 (SiN/SiO$_2$) is sufficient when the capacitance contact 4 is formed. In this case, the capacitance contact interlayer film 7 substantially composed of an SiO$_2$ film, and the direct nitride film 19 substantially composed of an SiN film are etched in respective etch steps. In these etch steps, etching processes of highly selective SiN/SiO$_2$ etch ratio are conducted. In summary, since no etching step is included after the etching of the direct nitride film 19, the possible reasons for reducing the spacing between the capacitance contact 4 and the bit line 6 and/or for causing the short-circuit between the capacitance contact 4 and the bit line 6 are omitted.

Figure 6:
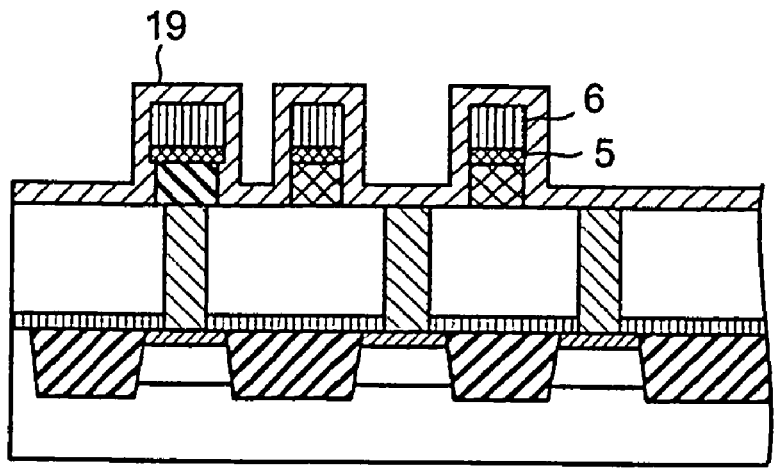
FIG. 6 is a cross sectional view of a semiconductor device for describing the method for manufacturing a semiconductor device of the first embodiment of the present invention.

Next, as shown in FIG. 6, the direct nitride film 19 consisting substantially of SiN is formed to cover the upper and side surfaces the bit line.

Although the present embodiment is described by illustrating the case of employing SiN for the direct nitride film 19, it should be understood that the present invention is not limited to such specific illustration, and other nitride film such as SiCN, SiON, SiC or the like may be used for the direct nitride film 19.

In addition, the method employed for forming the direct nitride film 19 may be a method for forming any of: a plasma-related CVD film; a sub-atmospheric CVD (SA-CVD) film; or an atomic layer deposition (ALD) film.

Figure 7:
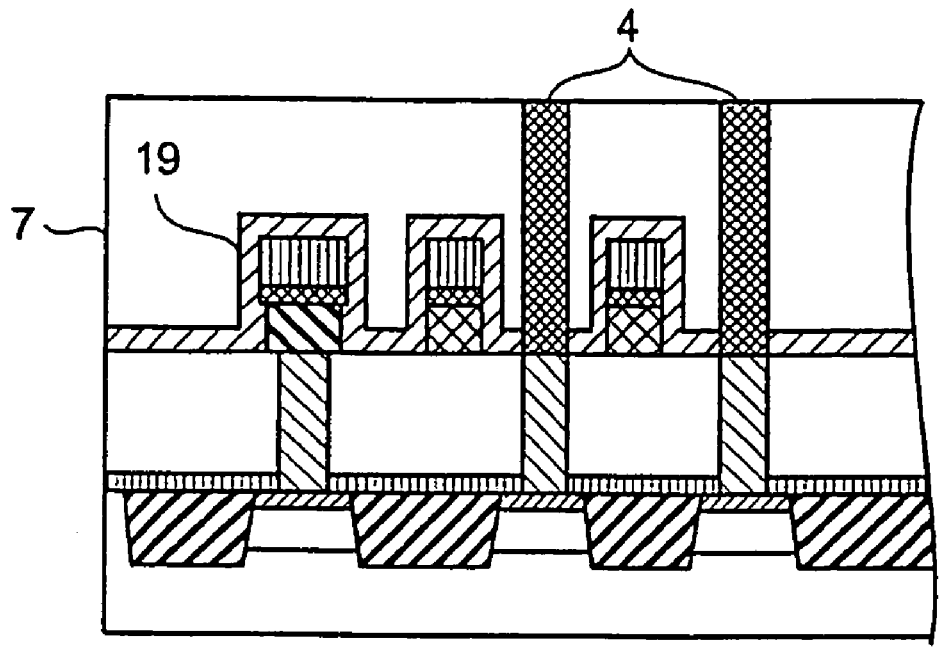
FIG. 7 is a cross sectional view of a semiconductor device for describing the method for manufacturing a semiconductor device of the first embodiment of the present invention.
Figure 8:
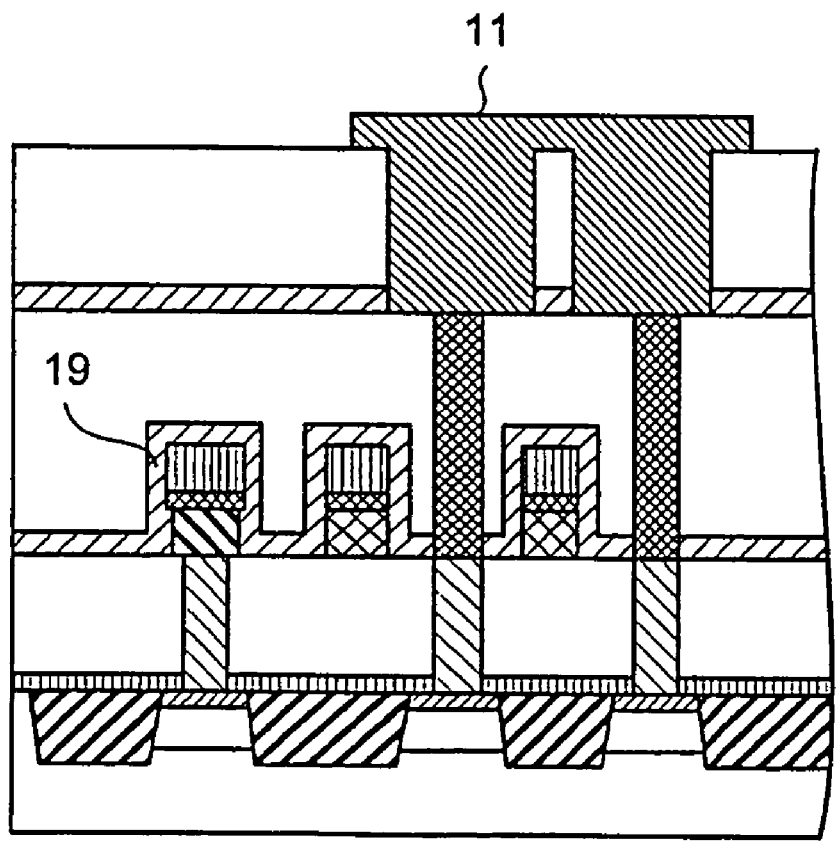
FIG. 8 is a cross sectional view of a semiconductor device for describing the method for manufacturing a semiconductor device of the first embodiment of the present invention.

Then, after forming the direct nitride film 19, the capacitance contact interlayer film 7 is formed similarly as in a conventional as shown in FIG. 7, and then the capacitance contact interlayer film 7 is partially etched to create the portion where the capacitance contact 4 is deposited. In such case, since the etching once stops at the direct nitride film 19, an over etch, in which the etch proceeds toward the lateral direction, can be suitably controlled, and thus the short-circuiting between the capacitance contact 4 formed on this portion and the bit line 6 can be inhibited. Then, the direct nitride film 19 underlying the etched portion of the capacitance contact layer is removed, and thereafter the capacitance contact 4 is formed thereon. Finally, as shown in FIG. 8, a capacitance element 11 is formed similarly as in the conventional method, and the semiconductor device of this embodiment is eventually completed.

Since the method for manufacturing the semiconductor device of this embodiment employs a configuration, in which the bit line 6 is covered by the direct nitride film 19 without employing the SAC process, the film thickness of the nitride film of the upper part of the bit line 6 is almost the same as the film thickness of side wall thereof. Therefore, the height of the bit line 6 itself can be reduced, and consequently, an aspect ratio of the L/S portion between the bit lines 6 can be reduced in the case of forming the capacitance contact interlayer film 7 after forming the bit line 6. Therefore, the situation where the capacitance contact interlayer film 7 cannot be formed between the bit lines 6 is scarcely occurred, and thus a further miniaturization becomes possible.

In addition, the SAC process include forming the side walls by forming the nitride films between the bit lines 6 and thereafter etching back the formed nitride film, so that the nitride films of side walls of bit lines 6 become thinner during the etch back process. Further, excessively thicker nitride film presents a situation where bit lines are mutually joined together. Therefore, when a miniaturization progresses to a certain level, it becomes difficult for the SAC process to form the side wall having a thickness greater than the predetermined thickness.

On the contrary, the present embodiment includes forming the direct nitride film so as to cover the bit line and does not include any further processing steps for the deposited nitride film such as etch back process. Thus the film thickness thereof is not reduced because the manufacturing process is free of the etch back process. Since the present embodiment provides forming nitride film having a predetermined film thickness on the side wall of the interconnect, unlike the SAC structure, the present invention is advantageous in the recent situation where a miniaturization are progressing.

Further, in the SAC process, there is higher necessity for involving higher selective etch ratio of the oxide film of the capacitance contact interlayer film 7 to the nitride film existing in the upper part and the side walls of the bit line 6, when the contact hole for the capacitance contact 4 is processed, and there is higher necessity for employing the nitride film having better film quality. However, since the necessity for involving higher selective etch ratio of the oxide film to the nitride film is quite low according to the method for manufacturing a semiconductor device of this embodiment, the necessity for depositing the nitride film having better film quality, which is required to be deposited at an elevated temperature, is also reduced. Therefore, the necessity for raising the deposition temperature for the direct nitride film 19 to an elevated temperature is reduced, and thus the configuration can be applicable to the combined logic/DRAM device comprising the transistor having higher performances.

Further, since the direct nitride film process in the method for manufacturing the semiconductor device of this embodiment is free of forming a hard mask film on the bit line 6, the height of the bit line 6 is designed to be lower. Therefore, the aspect ratio thereof can be small, and thus the filling thereof during the deposition of the direct nitride film 19 and/or the deposition of the capacitance contact interlayer film 7 can be promoted.

In addition, since thicker nitride film formed on the bit line provide thicker contact interlayer film in the SAC process, the thickness of the contact interlayer film becomes thicker, thereby providing higher contact resistance. On the contrary, the height of the bit line 6 can be designed to be lower by employing the method for manufacturing the semiconductor device according to the present embodiment by the reason stated above, thereby inhibiting the increase of the contact resistance.

Here, thicker nitride film is formed on the upper part of bit line 6 in the SAC process, and thus a layout of intentionally disposing the contact holes in the region of upper part of the bit lines 6 can be applied. On the contrary, it is difficult to employ a layout of intentionally disposing the contact holes in the region of upper part of the bit lines 6 according to the present embodiment, because the thickness of nitride film on the side wall of the bit line 6 is same as that on the upper surface, when the whole of the bit line 6 is covered with the direct nitride film 19, as described in this embodiment. In addition, if a layout of forming the contact hole between the bit line 6 and the bit line 6 is employed, it can hardly be occurred that the contact hole is formed in the upper portion of the bit line 6 by a misalignment.

That is, according to the present embodiment, advantageous effects described below can be obtained.

When the capacitance contact interlayer film is partially etched to create the portion where the capacitance contact is deposited, after the upper surface and the side surface of bit line and the upper part of the cell contact interlayer film are covered with the nitride film, the etch can be once stopped at the nitride film, and therefore the lateral progress of the etch can be controlled. Thus, the short circuit between the bit line and the capacitance contact can be inhibited without employing the SAC process. As a result, the number of the steps of the manufacturing process can be reduced and a miniaturization can be achieved. Further, since the necessity for employing the nitride film having better film quality is reduced, the configuration of the present embodiment is applicable to the combined logic/DRAM device comprising the transistor having higher performance, which tends to be deteriorated at an elevated temperature. Further, since the configuration includes covering the upper surfaces and the side surfaces of the bit lines with the nitride film, the insulating film is ensured to be formed between the bit line and the cell contact, thereby surely enabling the inhibition of the short circuit between the bit line and the cell contact.

Second Embodiment

Figure 9:
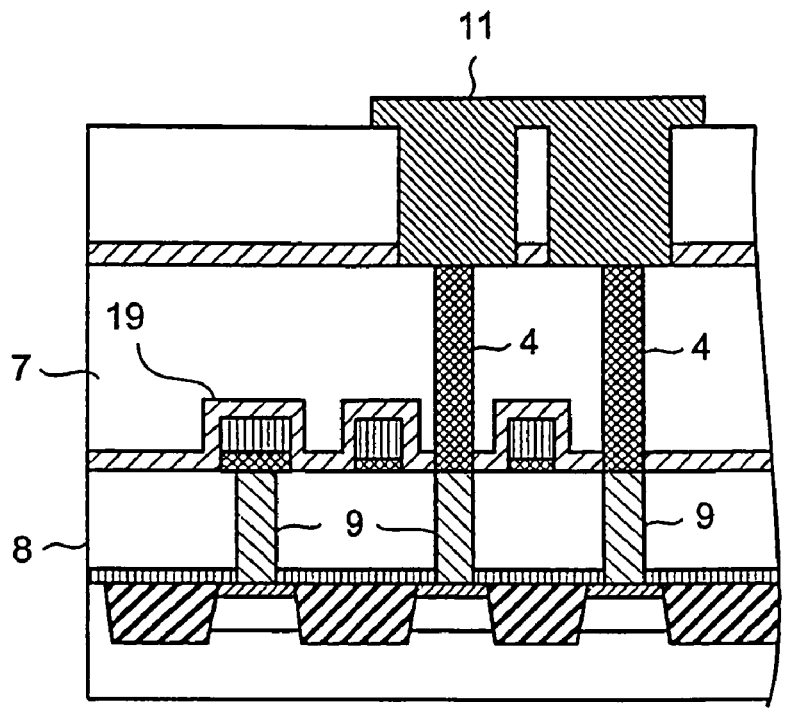
FIG. 9 is a cross sectional view of a semiconductor device manufactured according to a method for manufacturing a semiconductor device of the second embodiment of the present invention.

In the next, a method for manufacturing a semiconductor device of the second embodiment of the present invention will be described. A cross sectional view of a DRAM constituted by implementing the method for manufacturing the semiconductor device according to the present embodiment is shown in FIG. 9.

The semiconductor device according to the present embodiment typically represents a case where the feature of the present invention is applied to a DRAM having a constitution, in which a bit line 6 is formed directly on a cell contact interlayer film 8, without forming a bit contact interlayer film 13.

The present embodiment shows that the short circuit between the bit line 6 and the capacitance contact 4 can be inhibited by forming the bit line 6 directly on the cell contact interlayer film 8 without comprising a bit contact interlayer film 13.

The method for manufacturing the semiconductor device of the present embodiment will be described below, in reference to FIG. 10 to FIG. 14.

Figure 10:
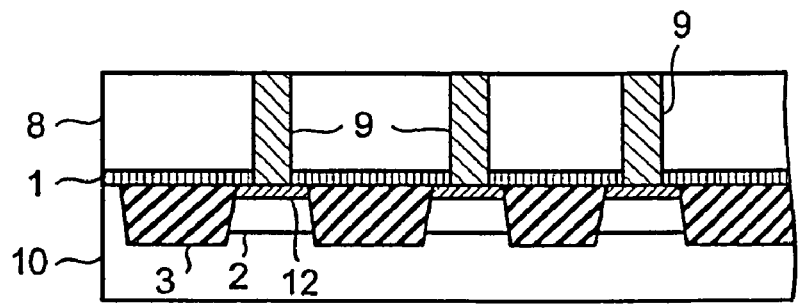
FIG. 10 is a cross sectional view of a semiconductor device for describing the method for manufacturing a semiconductor device of the second embodiment of the present invention.

First of all, as shown in FIG. 10, transistors for memory cells are formed on a silicon substrate 10 similarly as in the conventional method, and cell contact interlayer films 8 and cell contacts 9 are further formed.

Figure 11:
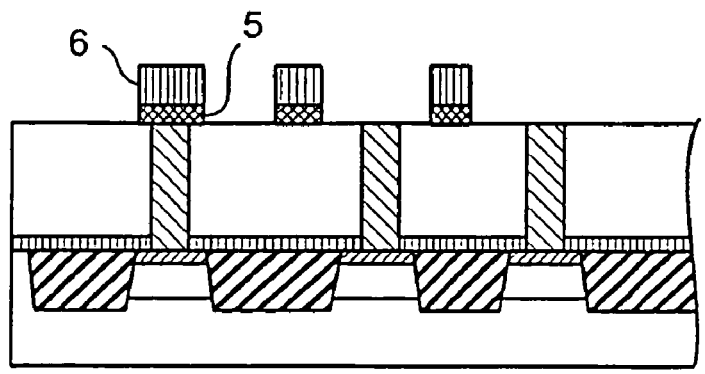
FIG. 11 is a cross sectional view of a semiconductor device for describing the method for manufacturing a semiconductor device of the second embodiment of the present invention.

Then, as shown in FIG. 11, titanium nitride (TiN) for forming barrier metal layers 5 and tungsten (W) for forming a bit line 6 are formed on the surface of the cell contact interlayer film 8. Then, the bit line 6 and the barrier metal layer 5 are patterned to a bit line shape by using a photo resist (not shown.) A cross sectional view of the semiconductor device after the steps so far is finished is shown in FIG. 11.

Figure 12:
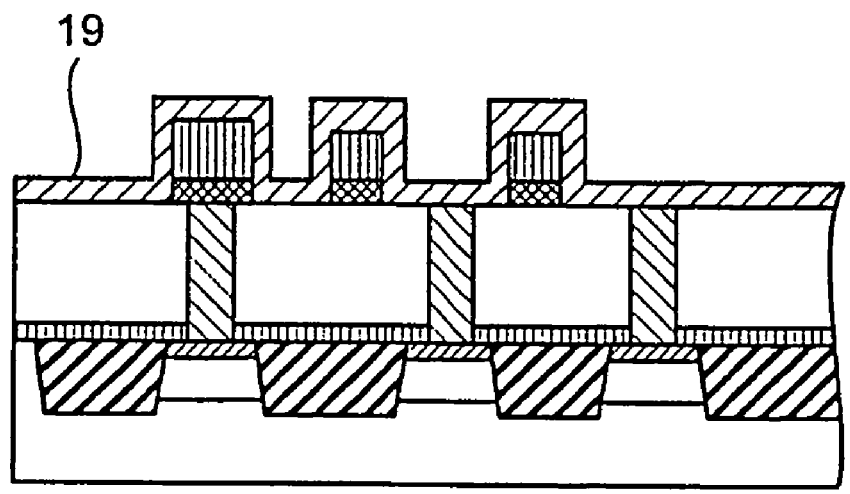
FIG. 12 is a cross sectional view of a semiconductor device for describing the method for manufacturing a semiconductor device of the second embodiment of the present invention.

Then, as shown in FIG. 12, a direct nitride film 19 consisting essentially of SiN is formed similarly as in the conventional method so as to cover the upper surface and the side surfaces of bit line 6.

The direct nitride film 19 is not limited to SiN in the present embodiment, and other nitride film such as SiON film, SiC film, SiCN film or the like can be used.

Figure 13:
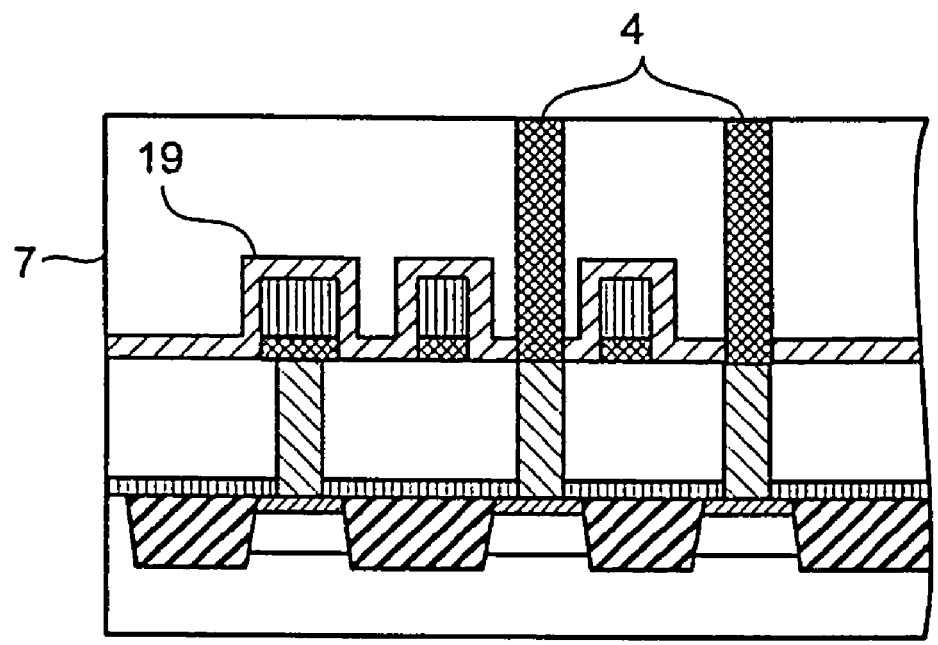
FIG. 13 is a cross sectional view of a semiconductor device for describing the method for manufacturing a semiconductor device of the second embodiment of the present invention.
Figure 14:
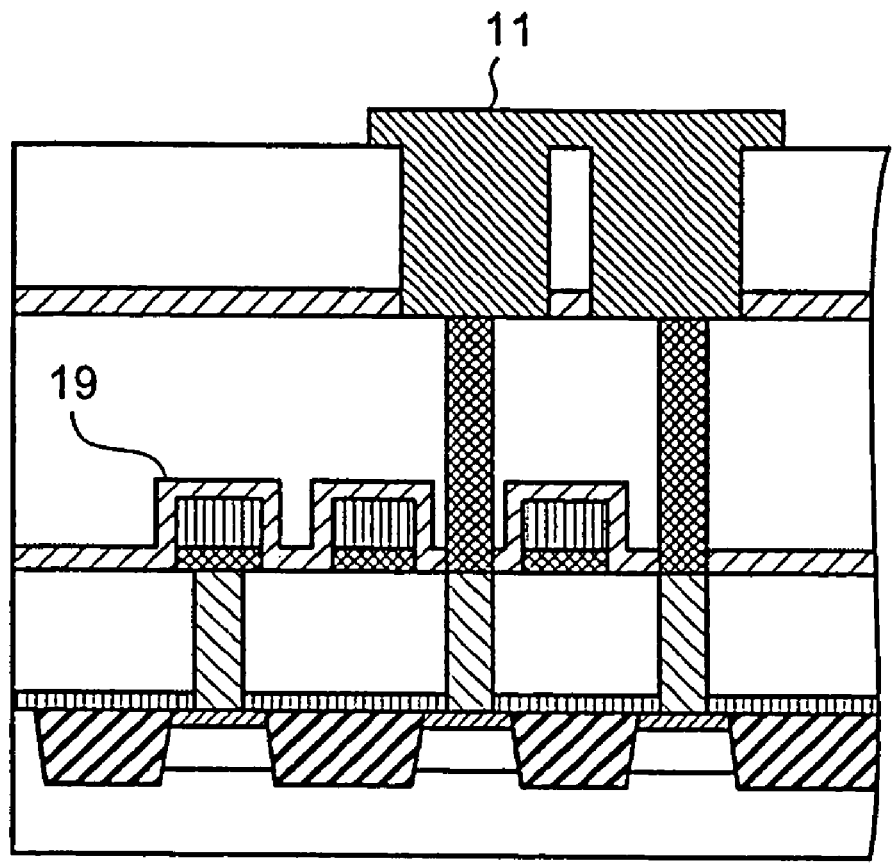
FIG. 14 is a cross sectional view of a semiconductor device for describing the method for manufacturing a semiconductor device of the second embodiment of the present invention.

After the direct nitride film 19 is formed, a capacitance contact interlayer film 7 and capacitance contacts 4 are formed similarly as in the conventional method, as shown in FIG. 13. Finally, a capacitance element 11 is formed similarly as in the conventional method as shown in FIG. 14, to complete the semiconductor device in the present embodiment.

It has been described in the above-described first and the second embodiment that the short circuit between the bit line 6 and the capacitance contact 4 can be prevented by employing the direct nitride film process. It is further possible to inhibit the short circuit between the bit line 6 and the cell contact 9 by employing the direct nitride film process, in addition to inhibiting the short circuit between the bit line 6 and the capacitance contact 4, by employing the direct nitride film process, in particular for the structure being free of the bit contact interlayer film 13. The reason is that the configuration having the nitride film existing between the cell contact 9 and the bit line 6 is superior to other configuration in preventing the short circuit therebetween.

More detailed description thereof may be that employing the direct nitride film process provides a configuration, in which a nitride film is disposed between the cell contact 9 and the bit line 6, instead of the capacitance contact interlayer film 7. Although typical interlayer insulating film such as capacitance contact interlayer film 7 generally comprises oxide film such as $SiO_2$, the nitride film is superior to the oxide film in providing the electric insulation, and the nitride film is also often superior to the oxide film in providing better coverage. Therefore, the anticipation of ensuring the formation of the insulating film between the bit line 6 and the cell contact 9 increases when direct nitride film process is employed.

Third Embodiment

In the next, a method for manufacturing a semiconductor device of the third embodiment of the present invention will be described.

Figure 15:
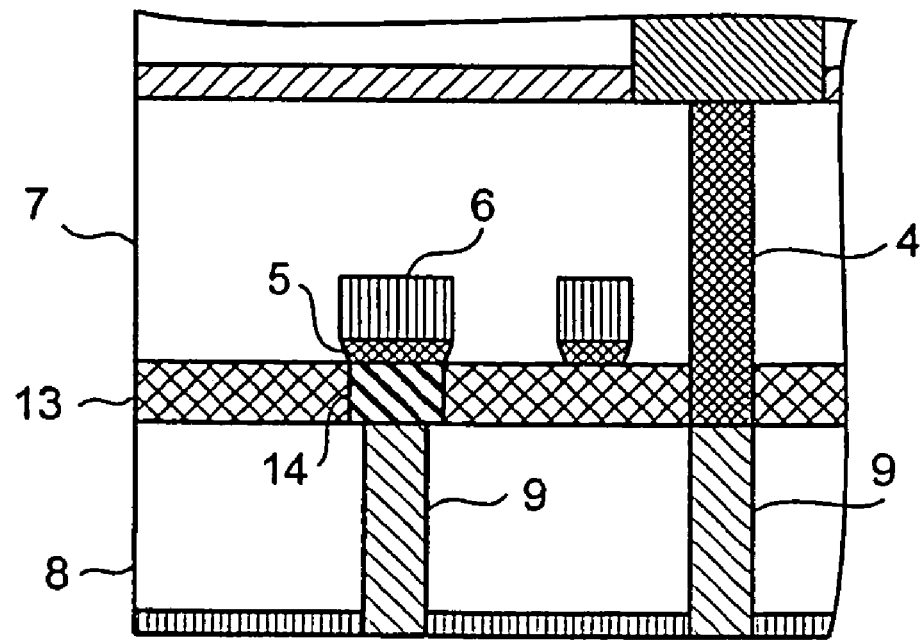
FIG. 15 is a cross sectional view of a semiconductor device typically illustrating a case where the method for manufacturing the semiconductor device of the third embodiment of the present invention is applied to a semiconductor device having a constitution, in which a bit contact interlayer film 13 is formed on a cell contact interlayer film 8.
Figure 16:
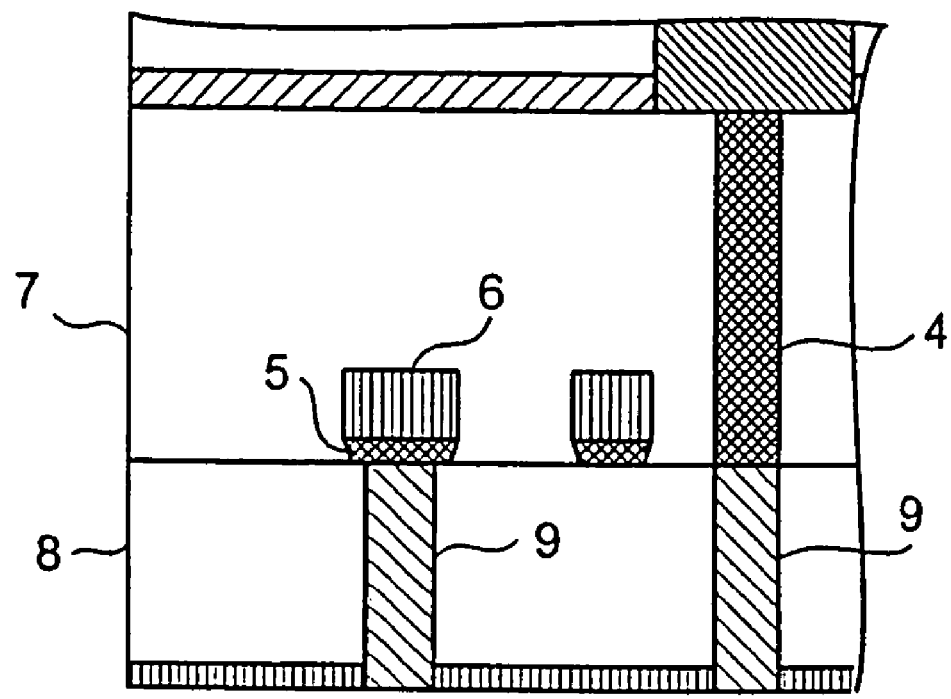
FIG. 16 is a cross sectional view of a semiconductor device typically illustrating a case where the method for manufacturing the semiconductor device of the third embodiment of the present invention is applied to a semiconductor device having a constitution, in which a bit contact interlayer film 13 is not formed on the cell contact interlayer film 8.

FIG. 15 and FIG. 16 are cross sectional views of a semiconductor device manufactured according to a method for manufacturing a semiconductor device of the third embodiment of the present invention. In FIG. 15 and FIG. 16, the same numerals are assigned to the same components that are also shown in FIG. 1, and thus the specific descriptions thereof are not presented.

FIG. 15 is a cross sectional view of a semiconductor device typically illustrating a case where the method for manufacturing the semiconductor device of the third embodiment of the present invention is applied to a semiconductor device having a constitution, in which a bit contact interlayer film 13 is formed on a cell contact interlayer film 8 and a bit line 6 is formed on the bit contact interlayer film 13. FIG. 16 is a cross sectional view of a semiconductor device typically illustrating a case where the method for manufacturing the semiconductor device of the third embodiment of the present invention is applied to a semiconductor device having a constitution, in which a bit line 6 is formed directly on a cell contact interlayer film 8, without forming a bit contact interlayer film 13 on the cell contact interlayer film 8.

In the method for manufacturing the semiconductor device of the present embodiment, a barrier metal layer 5 composed of titanium nitride is etched to form an inversely-tapered shape by using a gas of CF4 or the like which is capable of selectively etching only titanium nitride (TiN) during the formation of the bit line 6. Then, the barrier metal layer 5 is selectively etched, and thereafter a capacitance contact interlayer film 7 and a capacitance contact 4 or the like are formed similarly as in the conventional method.

Since wider spacings between the bit line 6 and the cell contact 9 and/or between the bit line 6 and the capacitance contact 4 can be presented by having a configuration including selectively etching the barrier metal film 5 of the bit line 6 to form an inversely-tapered shape according to the above-described aspect of the present invention, this configuration provides the inhibition of the short circuits between the bit line 6 and the cell contact 9 and/or between the bit line 6 and the capacitance contact 4.

Further, since wider spacing between the bit line 6 and the cell contact 9 can be presented by having a configuration including selectively etching the barrier metal film 5 to form an inversely-tapered shape according to the present embodiment, this configuration reduces, depending on the circumstances, the need for having a larger room for the spacing for preventing the short circuit between the bit line 6 and the cell contact 9 by comprising a bit contact interlayer film 13.

Having such configuration, the process steps for forming the bit contact interlayer film 13 and the bit contact 14 can be omitted, and the bit contact resistance can also be reduced.

The reason for providing larger room for the spacing for preventing the short circuit between the bit line 6 and the cell contact 9 or the capacitance contact 4 by etching the barrier metal film 5 to form an inversely-tapered shape will be described as follows in reference to FIGS. 17A to 17E. Here, the geometric aspects thereof are exaggerated in FIGS. 17A to 17E, for helping the readers to suitably understand the characteristics of the configuration shown in these figures.

In etching of the bit line 6 and the barrier metal layer 5, masks 18a and 18b are precedently the barrier metal layer formed on the bit line 6.

Figure 17A:
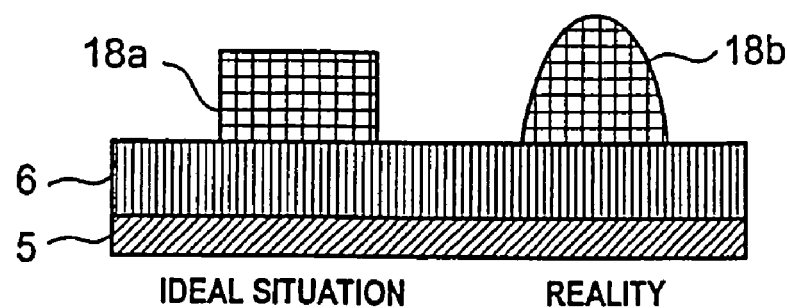
FIGS. 17A to 17E are cross sectional views of the multi-layer structure having photo resists thereon, for describing the reason for preventing the short circuit between the bit line 6 and either of the cell contact 9 and the capacitance contact 4 by etching the barrier metal layer 5 into an inversely-tapered shape.
Figure 17B:
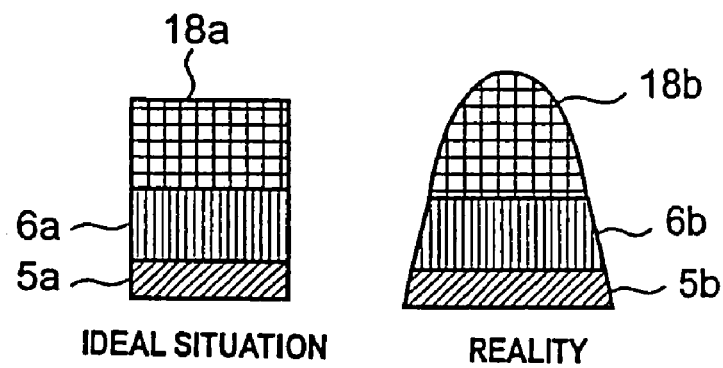
Figure 17C:
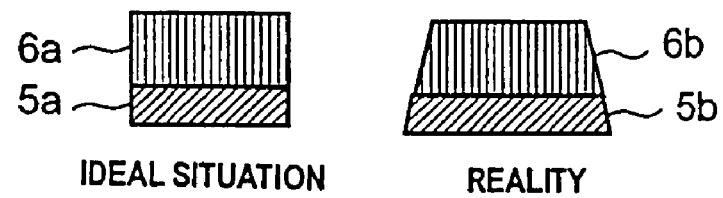
Figure 17D:
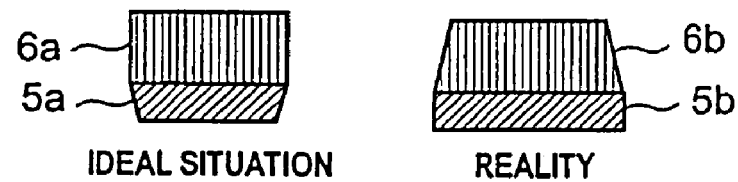
Figure 17E:
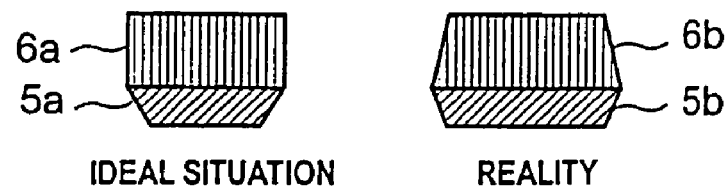
Figure 18:
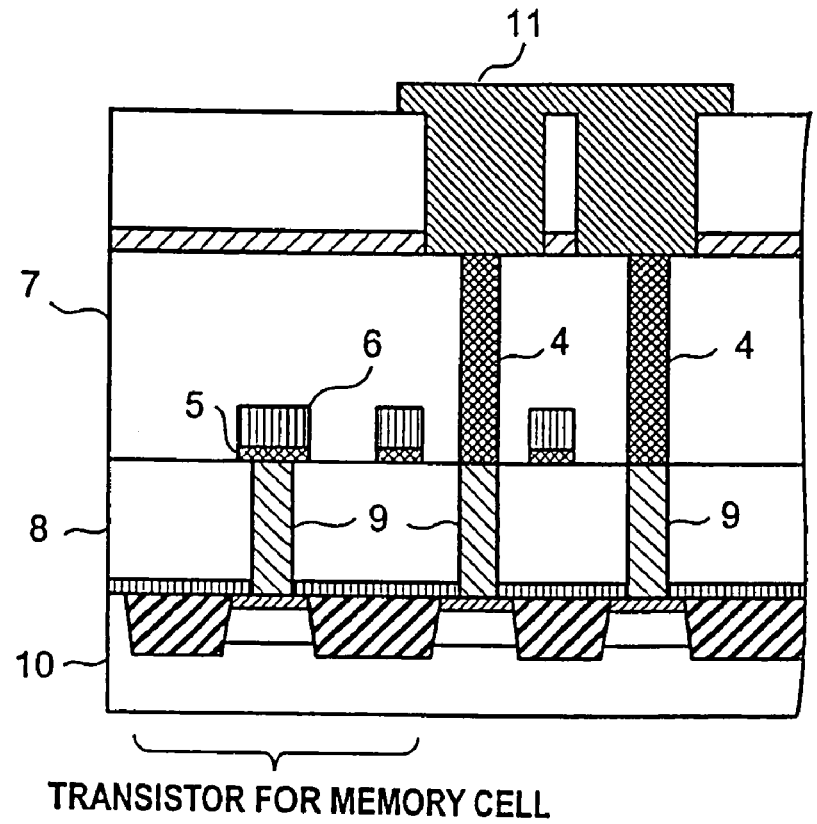
FIG. 18 is a cross sectional view of a conventional semiconductor device.
Figure 19:
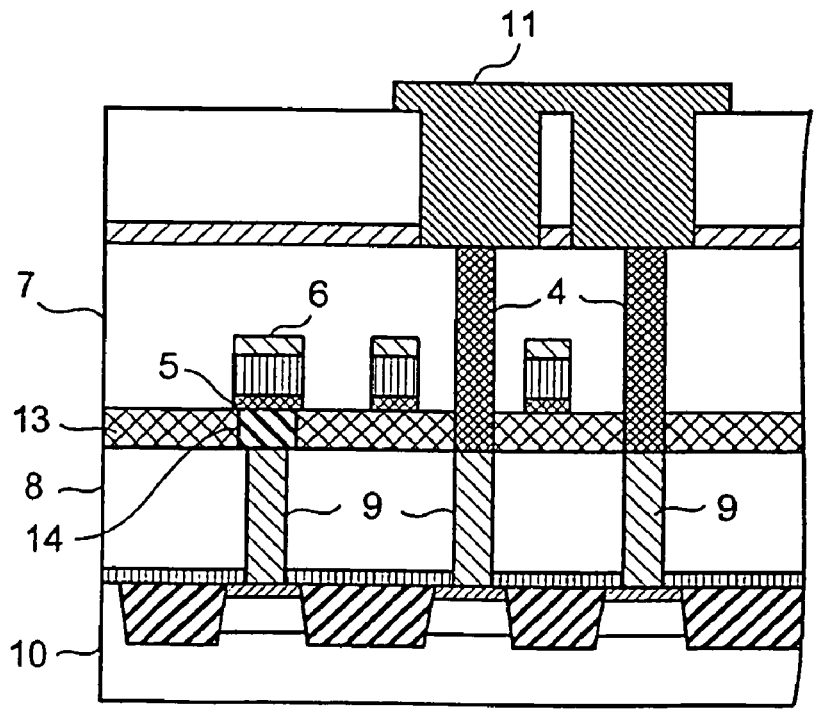
FIG. 19 is a cross sectional view of a conventional semiconductor device, in which the bit contact interlayer film 13 is further formed on cell contact interlayer film 8.
Figure 23:
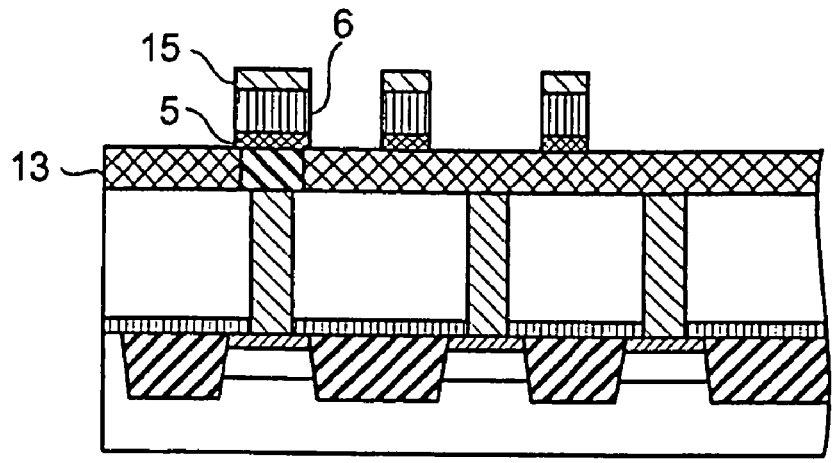
FIG. 23 is a cross sectional view of a conventional semiconductor device, for describing the method for manufacturing the semiconductor device of SAC structure.
Figure 24:
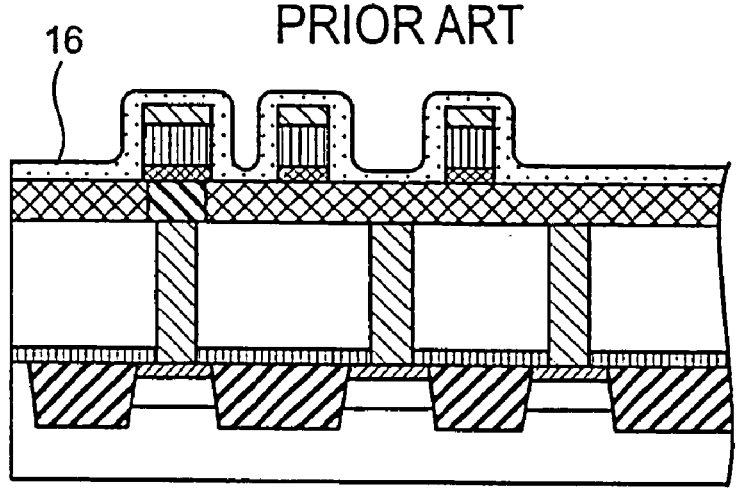
FIG. 24 is a cross sectional view of a conventional semiconductor device, for describing the method for manufacturing the semiconductor device of SAC structure.
Figure 25:
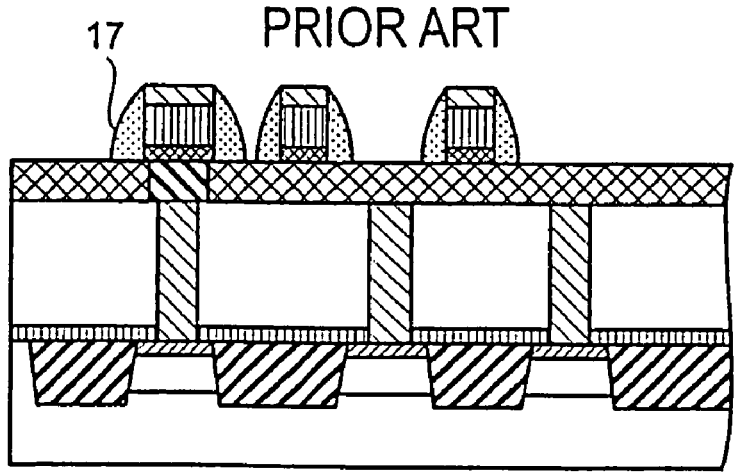
FIG. 25 is a cross sectional view of a conventional semiconductor device, for describing the method for manufacturing the semiconductor device of SAC structure.
Figure 26:
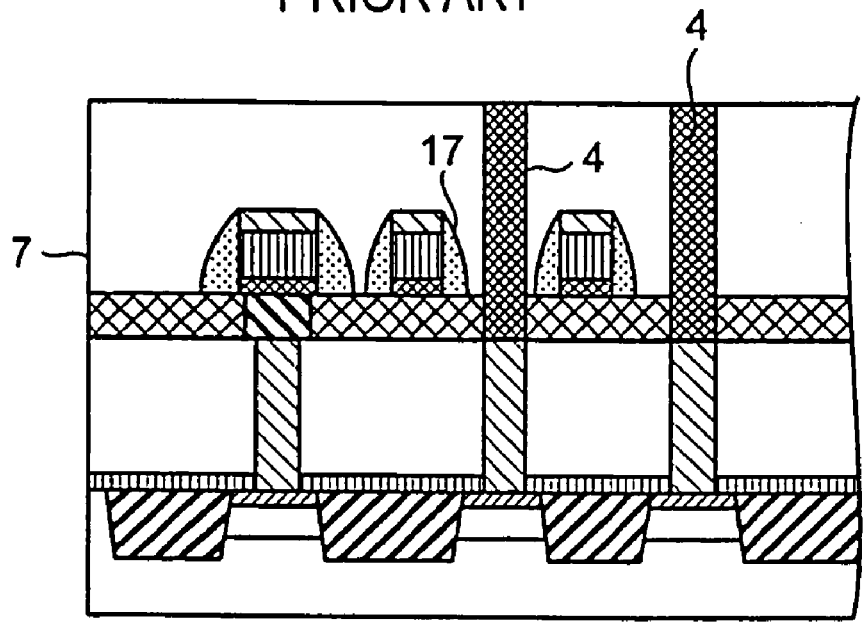
FIG. 26 is a cross sectional view of a conventional semiconductor device, for describing the method for manufacturing the semiconductor device of SAC structure.
Figure 27:
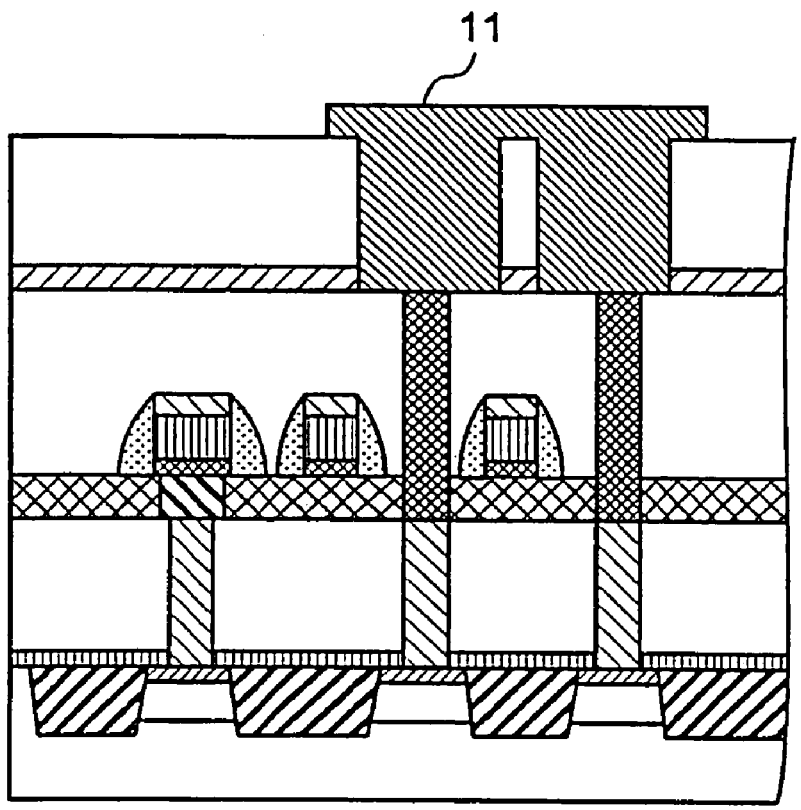
FIG. 27 is a cross sectional view of a conventional semiconductor device, for describing the method for manufacturing the semiconductor device of SAC structure.

In this case, although the ideal situation is to have the rectangular shape shown in FIG. 17A as the mask 18a, reality may be that the rounded shape of the mask 18. Thus, although the ideally expected etched features by the etching process via using the masks 18a and 18b should have been the shapes shown as a bit line 6a and a barrier metal layer 5a in FIG. 17B, the actually obtainable etched features are the trapezoid shape, which are shown as a bit line 6b and a barrier metal layer 5b. In this occasion, after stripping the mask 18a and 18b, the actually obtainable geometry of the etched features may be that the width of the barrier metal layer 5b is wider than that of the bit line 6b, as shown in FIG. 17C. Therefore, as shown in FIG. 17D only the barrier metal layer 5b is selectively etched to form an inversely-tapered shape to remove the tapered portion of the barrier metal layer 5b wider than the bit line 6, as in the present embodiment, thereby providing larger room for the spacing for preventing the short circuit between the bit line 6 and the cell contact 9 or the capacitance contact 4. In addition to above, even if the etched barrier metal layer 5b actually has the unwanted trapezoid shape as shown in FIG. 17C, the barrier metal layer 5b is further selectively etched to form the shape of barrier metal layer 5b into the inversely-tapered shape, as shown in FIG. 17E, thereby ensuring a room for the spacing from the cell contact 9.

An example of the specific condition for etching the barrier metal layer 5 is shown as follows.

Temperature: 50 to 400 degree C. (e.g., 180 degree C.);
Pressure: 100 to 1,000 mTorr (e.g., 600 mTorr);
Power: 500 to 2,000 W (e.g., 1,200 W): and
Volumetric flow rate of O2/CF4 gases
O2: 500 to 2,000 sccm,
CF4: 5 to 30 sccm (e.g., O2/CF4=1,000/12).

The present embodiment may be implemented alone, or may be applied to the semiconductor device of the above-described first and the second embodiments.

In summarize, the present embodiment, the following advantageous effects can be obtained.

Since wider spacings between the bit line and the cell contact and/or between the bit line and the capacitance contact can be presented by having a configuration including selectively etching the barrier metal film of the bit line to form an inversely-tapered shape, this configuration provides larger room for the spacing for preventing the short circuit between the bit line and the cell contact and/or between the bit line and the capacitance contact.

Fourth Embodiment

Fourth embodiment according to the present invention is illustrated in FIGS. 28 to 36.

Figure 28:
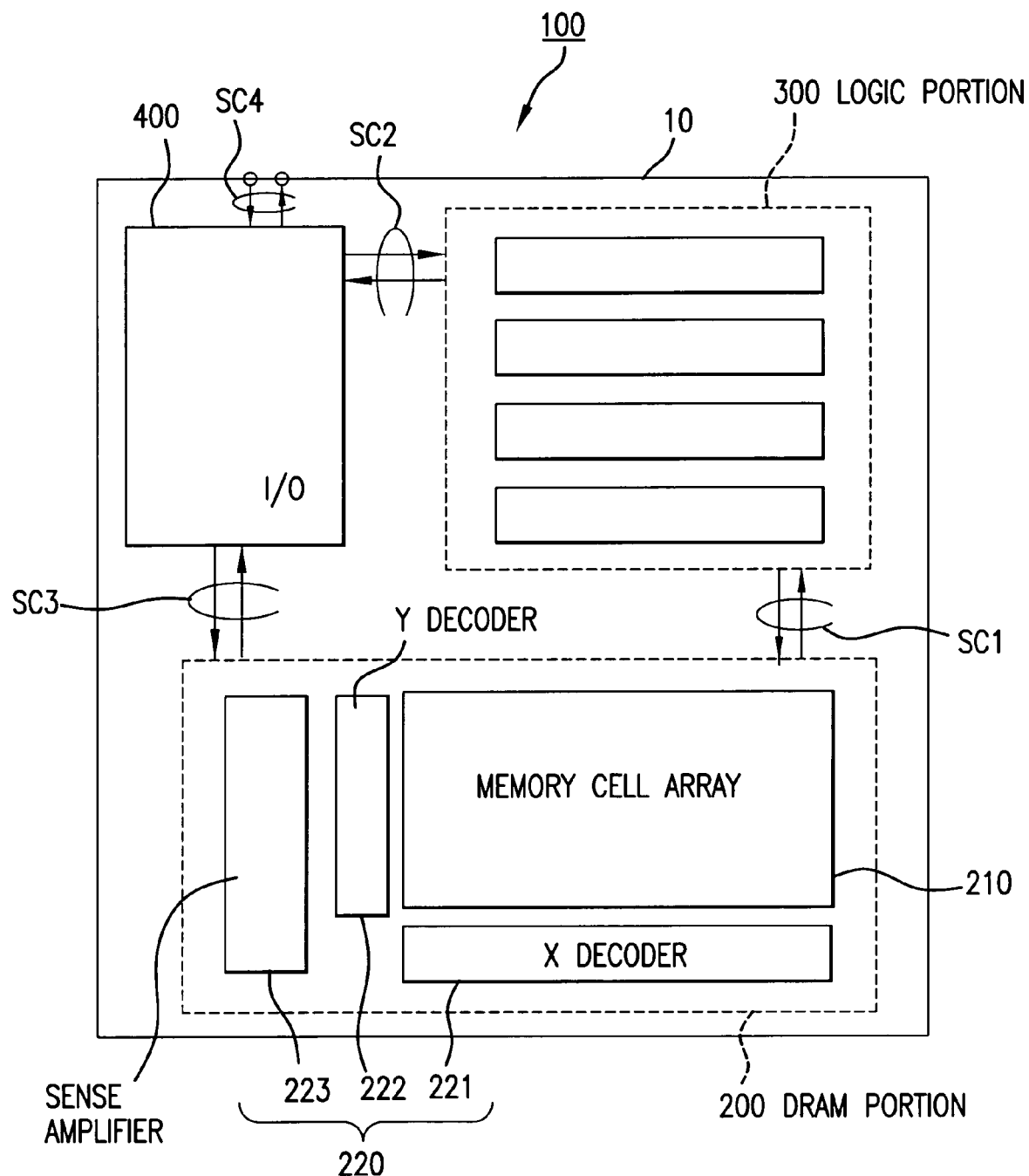
FIG. 28 is a schematic diagram of a semiconductor device according to the fourth embodiment of the present invention.

FIG. 28 is a schematic diagram of a semiconductor device 100 according to the present embodiment. In the semiconductor device 100, a DRAM portion 200 and a Logic portion 300 are formed on one piece of a semiconductor substrate 10. An input-output (I/O) portion 400 is also formed on the semiconductor substrate 10.

The DRAM portion 200 includes a memory cell array 210. The memory cell array 210 comprises a plurality of capacitors disposed to form a matrix-pattern (not shown). Retention and erase of data are conducted by charging to and discharging from each of the capacitors in the memory cell array 210. In addition, the DRAM portion 200 has a peripheral circuit 220. The peripheral circuit 220 provides a function to the DRAM portion 200 as a memory device, in conjunction with the memory cell array 210. The peripheral circuit 220 includes, for example, an X decoder 221, a Y decoder 222 and a sense amplifier 223.

The DRAM portion 200 and the Logic portion 300 mutually conduct delivery of data (SC1). More specifically, the Logic portion 300 conducts an arithmetic operation, and transfers the data obtained by the arithmetic operation to the DRAM portion 200. Then, the DRAM portion 200 stores data received from the Logic portion 300. Alternatively, the Logic portion 300 retrieves data stored in the DRAM portion 200, and conducts an operation based on the retrieved data.

In addition, the I/O portion 400 retrieves data from an external of the semiconductor device 100 (SC 4), and transfers the data to the Logic portion 300 and the DRAM portion 200 (SC2 and SC3).

Figure 29:
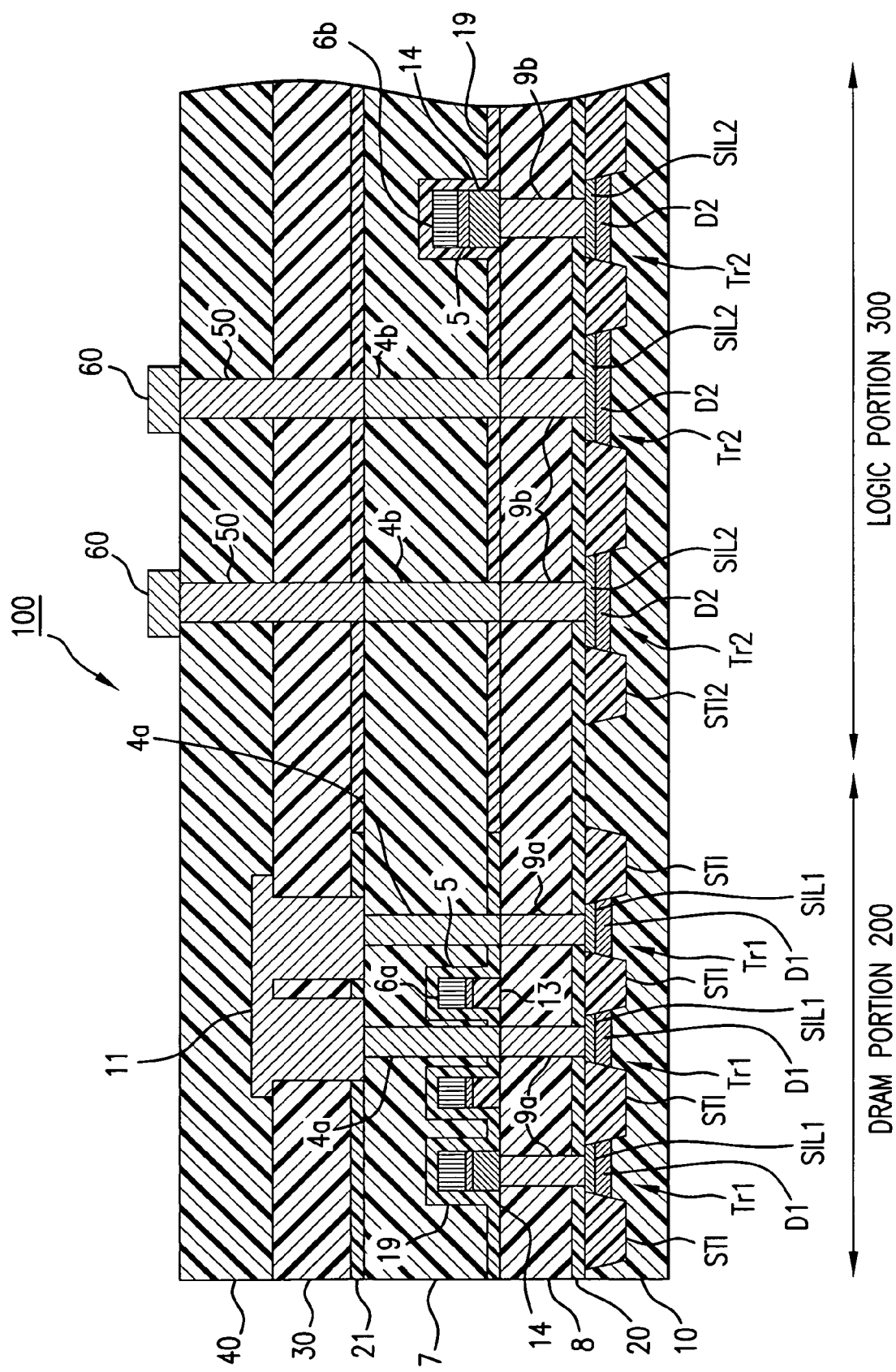
FIG. 29 is a cross-sectional view of the semiconductor device according to the fourth embodiment of the present invention.

FIG. 29 is a cross-sectional view of the semiconductor device 100 according to the present embodiment.

The semiconductor 100 contains a semiconductor substrate 10 having a DRAM portion 200 and a Logic portion 300; a first transistor Tr1 in the DRAM portion 200; a second transistor Tr2 in the Logic portion 300; a first insulating layer 8 covering the DRAM portion 200 and the Logic portion 300; a first contact plug 9a formed in the first insulating layer 8 in electrically contact with the first transistor Tr1 in the DRAM portion 200; a first bit line 6a for the DRAM portion 200 formed on the first insulating layer 8 in electrically contact with the first contact plug 9a; a nitride film 19 formed in contact with the first insulating layer 8 to cover the DRAM portion 200 and the Logic portion 300, wherein the first bit line 6a locating between the first insulating layer 8 and the nitride film 19.

Alternatively, the semiconductor device 100 contains a semiconductor substrate 10 having a DRAM portion 200 and a Logic portion 300; a first transistor Tr1 formed in the DRAM portion 200; a second transistor Tr2 formed in the Logic portion 300; a first insulating layer 8 covering the DRAM portion 200 and the Logic portion 300; a first contact plug 9a formed in the first insulating layer 8 in electrically contact with the first transistor Tr1 in the DRAM portion 200; a first bit line 6a for the DRAM portion 200 formed on one portion of the first insulating layer 8 in electrically contact with the first contact plug 9a; a nitride film 19 formed in contact with the first bit line 6a and with another portion of the first insulating layer 8, the nitride film 19 being extend to cover the Logic portion 300.

The DRAM portion 200 and the Logic portion 300 are formed on one piece of a semiconductor substrate 10. As for the DRAM portion 200, only a portion thereof peripheral to the capacitor is illustrated. As for the Logic portion 300, only a portion thereof is illustrated.

Transistors Tr1 for exhibiting a function of the DRAM are provided in the DRAM portion 200. The transistor Tr1 includes an impurity region D1, which will be a source or a drain. Silicide layers SIL1 are formed on the surface of the impurity region D1. Each of the transistors Tr1 is isolated by shallow trench isolation layers STI1.

Transistors Tr2 as second transistors composing the Logic circuit is similarly formed in the Logic portion 300. The transistor Tr2 includes an impurity region D2, which will be a source or a drain. Silicide layers SIL2 are formed on the surface of the impurity region D2. Each of the transistors Tr2 is isolated by shallow trench isolation films STI2.

An insulating film 20 is formed on the semiconductor substrate 10 to cover the DRAM portion 200 and the Logic portion 300. The insulating film 20 is composed of, for example, a material such as SiN, SiON, SiCN and the like. This insulating film 20 also functions as preventing water entering from the upper layer into the semiconductor substrate 10.

An interlayer film 8 is formed on the insulating film 20 to cover the DRAM portion 200 and the Logic portion 300.

Contact plugs 9a, 9b as the first and second contact plugs, respectively, are provided through the insulating film 20 and the interlayer film 8. The contact plugs 9a, 9b are in electrically contact with the impurity layers D1 and D2 via the silicide layers SIL1 and SIL2, respectively.

A bit contact 14, a barrier metal 5 and a bit line 6a or 6b as the first or second bit line are sequentially formed on some of the contact plugs 9a or 9b in this order to provide a multiple-layered structure. The bit lines 6a, 6b are in electrically contact with the impurity layers D1 and D2 via the contact plugs 9a, 9b, respectively.

A nitride film 19 is formed on the interlayer film 8 so as to contact with the bit line 6a of the DRAM portion 200. The nitride film 19 covers the top surface of the interlayer film 8 and the side surfaces and the top surface of the bit line 6a. The nitride film 19 is extending to cover the Logic portion 300. The nitride film 19 also contacts with the bit line 6b of the Logic portion 300. The nitride film 19 prevents water from entering from the top of the nitride film 19 into the lower layer. Therefore, the deterioration in the performance of the transistors Tr1 and Tr2 of the DRAM portion 200 and the Logic portion 300, which is otherwise caused due to such water, can be avoided. Thus, an advantageous effect of providing an improved reliability of the semiconductor device 100 can be presented.

An interlayer film 7 is formed on the nitride film 19 so as to cover the DRAM portion 200 and the Logic portion 300.

Contact plugs 4a as third contact plugs are formed in the nitride film 19 and the interlayer film 7. The contact plugs 4a are in electrically contact with the corresponding contact plugs 9a, respectively. The contact plugs 4b formed in the Logic portion 300 are also in electrically contact with the corresponding contact plugs 9b, respectively, in the same manner.

An insulating film 21 and an interlayer film 30 are sequentially formed in this order on the interlayer film 7 so as to cover the DRAM portion 200 and the Logic portion 300. The insulating film 21 is composed of a material such as, for example, SiON, SiCN, SiN and the like. Capacitors 11 for memory cell are formed in the interlayer film 30 of the DRAM portion 200. A lower electrode of the capacitor 11 for memory cell is in electrically contact with the contact plug 4a.

An interlayer film 40 is formed on the interlayer film 30. Contact plugs 50 are provided so as to extend through the interlayer films 30 and 40. The contact plug 50 is in electrically contact with the contact plug 4b of the Logic portion 300.

Interconnects 60 are formed on the interlayer film 40. The interconnect 60 is in electrically contact with the contact plug 50. More specifically, the interconnect 60 is in electrically contact with the transistor Tr2 via the contact plugs 50, 4b and 9b.

A process for manufacturing the semiconductor device 100 to according to the fourth embodiment will be described as follows.

Figure 30:
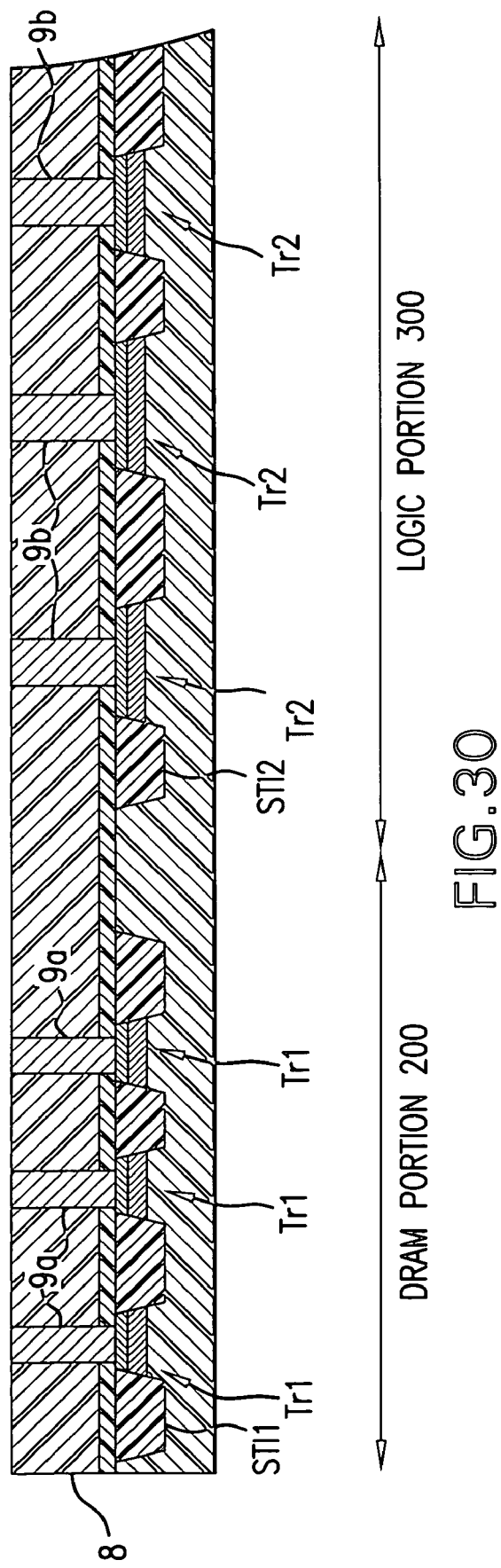
FIG. 30 is a cross sectional view of a semiconductor device typically illustrating a case where the method for manufacturing the semiconductor device of the fourth embodiment of the present invention.

As shown in FIG. 30, transistors Tr1 and Tr2 and the shallow trench isolation films STI1 and STI2 are formed in the semiconductor substrate 10. Then, the insulating film 20 and the interlayer film 8 are sequentially formed in this order on the semiconductor substrate 10, so as to cover the DRAM portion 200 and the Logic portion 300. Then, the contact plugs 9a, 9b are formed in the interlayer film 8 over the DRAM portion 200 and the Logic portion 300. The contact plugs 9a in the DRAM portion 200 and the contact plugs 9b in the Logic portion 300 are simultaneously formed.

Figure 31:
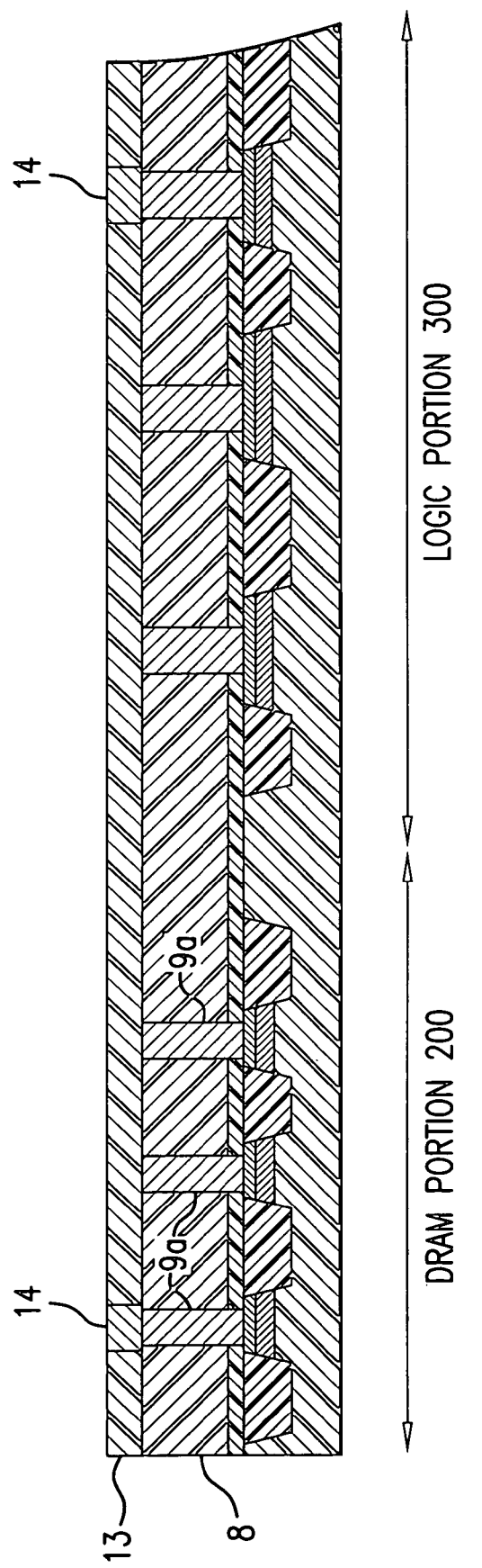
FIG. 31 is a cross sectional view of a semiconductor device typically illustrating a case where the method for manufacturing the semiconductor device of the fourth embodiment of the present invention.

Then, as shown in FIG. 31, an interlayer film 13 is formed on the interlayer film 8, so as to cover the DRAM portion 200 and the Logic portion 300. Then, the bit contacts 14 are formed in the interlayer film 13.

Figure 32:
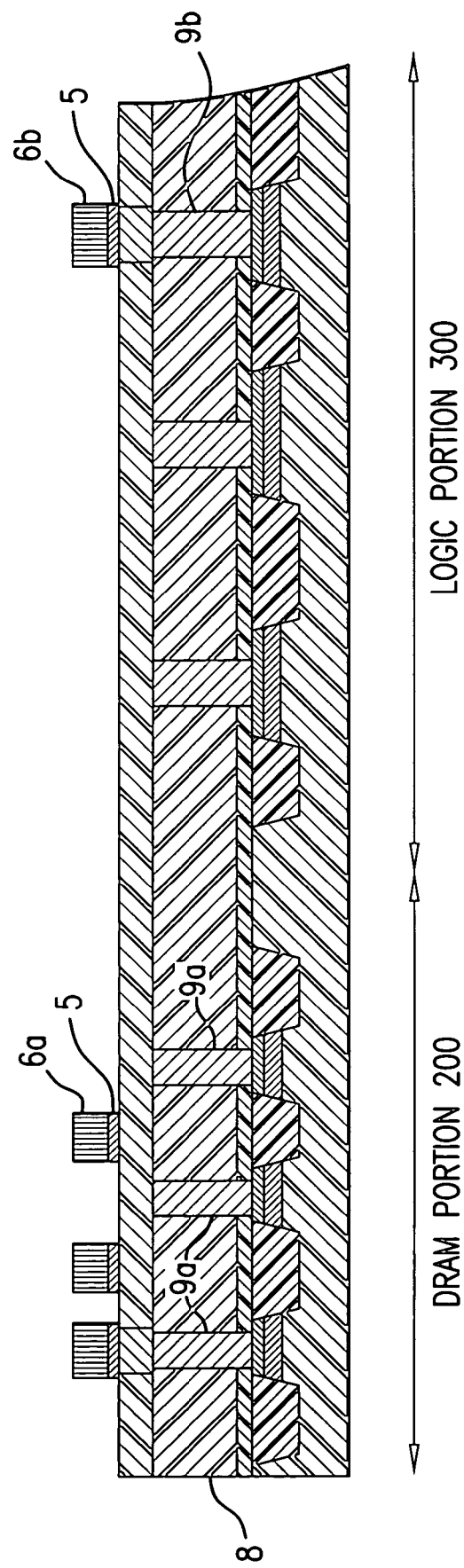
FIG. 32 is a cross sectional view of a semiconductor device typically illustrating a case where the method for manufacturing the semiconductor device of the fourth embodiment of the present invention.

Next, as shown in FIG. 32, TiN films for barrier layers 5 and tungsten films for bit lines 6a, 6b are formed on the interlayer film 13. Then, the TiN film and the tungsten film are patterned via a photolithographic technology to obtain bit lines 6a, 6b.

Figure 33:
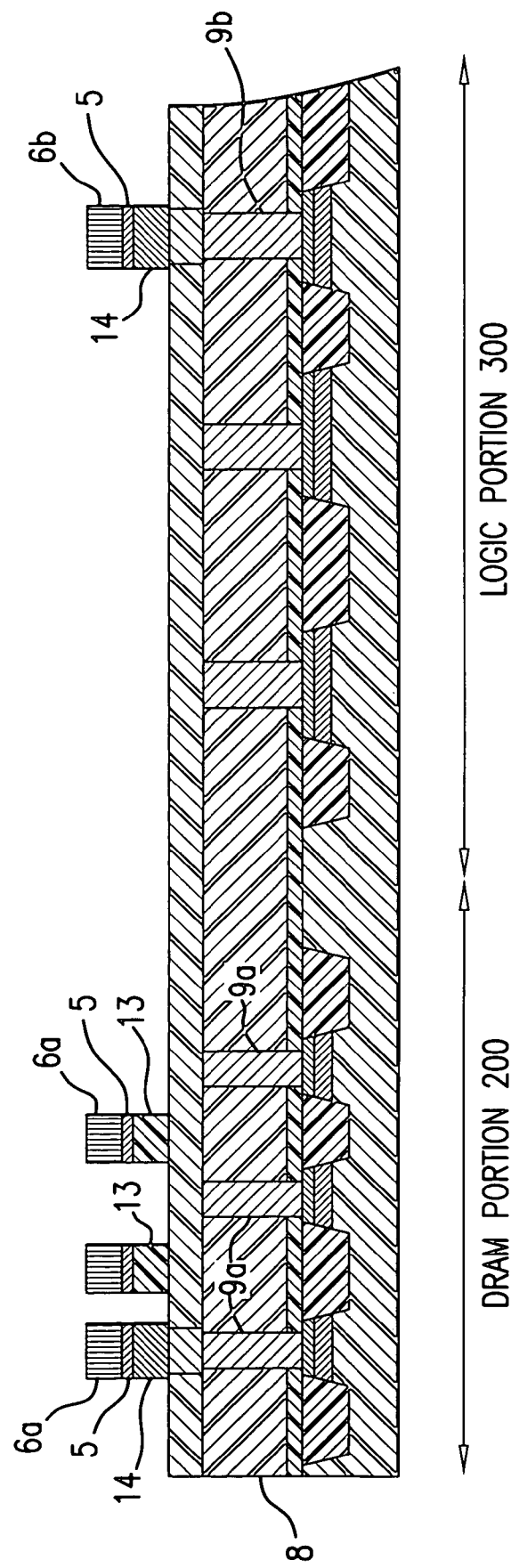
FIG. 33 is a cross sectional view of a semiconductor device typically illustrating a case where the method for manufacturing the semiconductor device of the fourth embodiment of the present invention.

Then, as shown in FIG. 33, the interlayer film 13 is etched through the mask of the bit lines 6a, 6b. This etching process provides exposing the contact plugs 9a (and 9b) that are not coupled to the bit lines 6a (and 6b) to the surface of the interlayer film 8.

Figure 34:
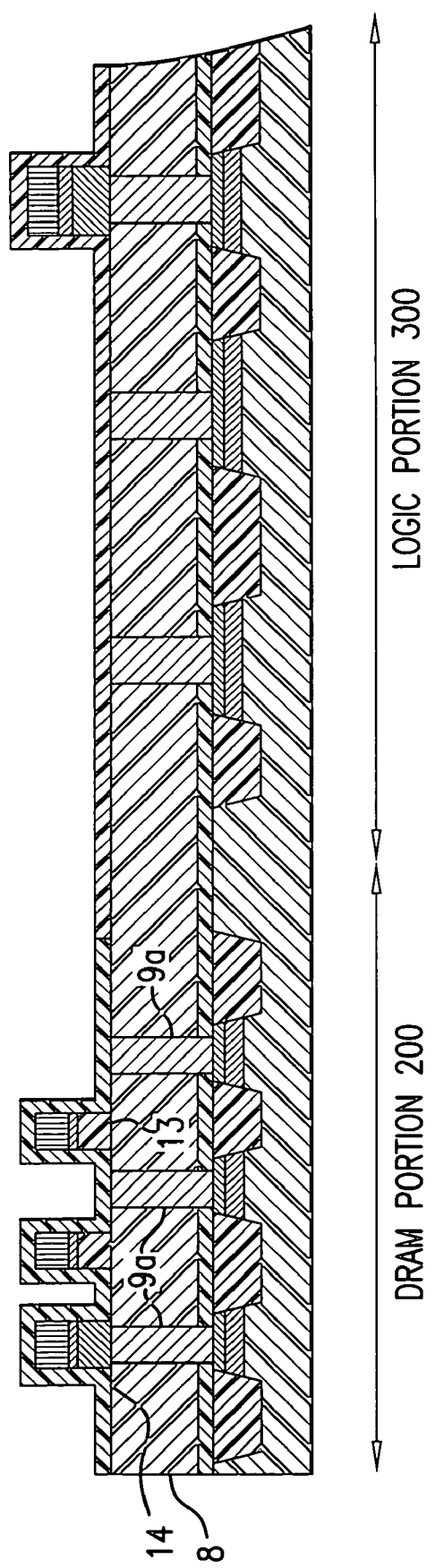
FIG. 34 is a cross sectional view of a semiconductor device typically illustrating a case where the method for manufacturing the semiconductor device of the fourth embodiment of the present invention.

Then, as shown in FIG. 34, the nitride film 19 is formed so as to cover the DRAM portion 200 and the Logic portion 300. This nitride film 19 is in contact with the interlayer film 8, the top surfaces and the side surfaces of the bit lines 6a, 6b and the side surfaces of the barrier layers 5. In such case, the nitride film 19 covers at least the DRAM portion 200 and the Logic portion 300. A simple and easy manufacture can be achieved if the nitride film 19 is formed to cover the entire surface of semiconductor substrate 10.

Figure 35:
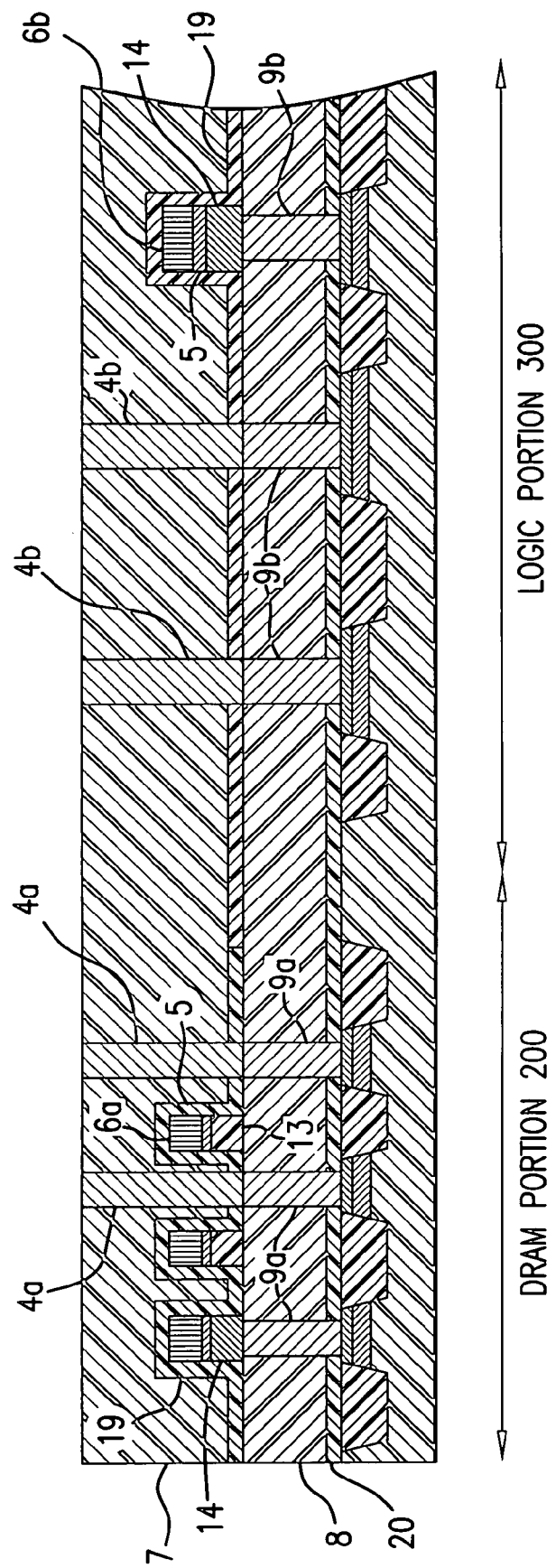
FIG. 35 is a cross sectional view of a semiconductor device typically illustrating a case where the method for manufacturing the semiconductor device of the fourth embodiment of the present invention.

Then, as shown in FIG. 35, the interlayer film 7 is formed on the nitride film 19 so as to cover the DRAM portion 200 and the Logic portion 300. Then, the contact plugs 4a, 4b are formed. The contact plug 4a, 4b extends through the nitride film 19 and the interlayer film 7, and is in electrically contact with the contact plug 9a, 9b that has no coupling with the bit line 6a, 6b, respectively.

Figure 36:
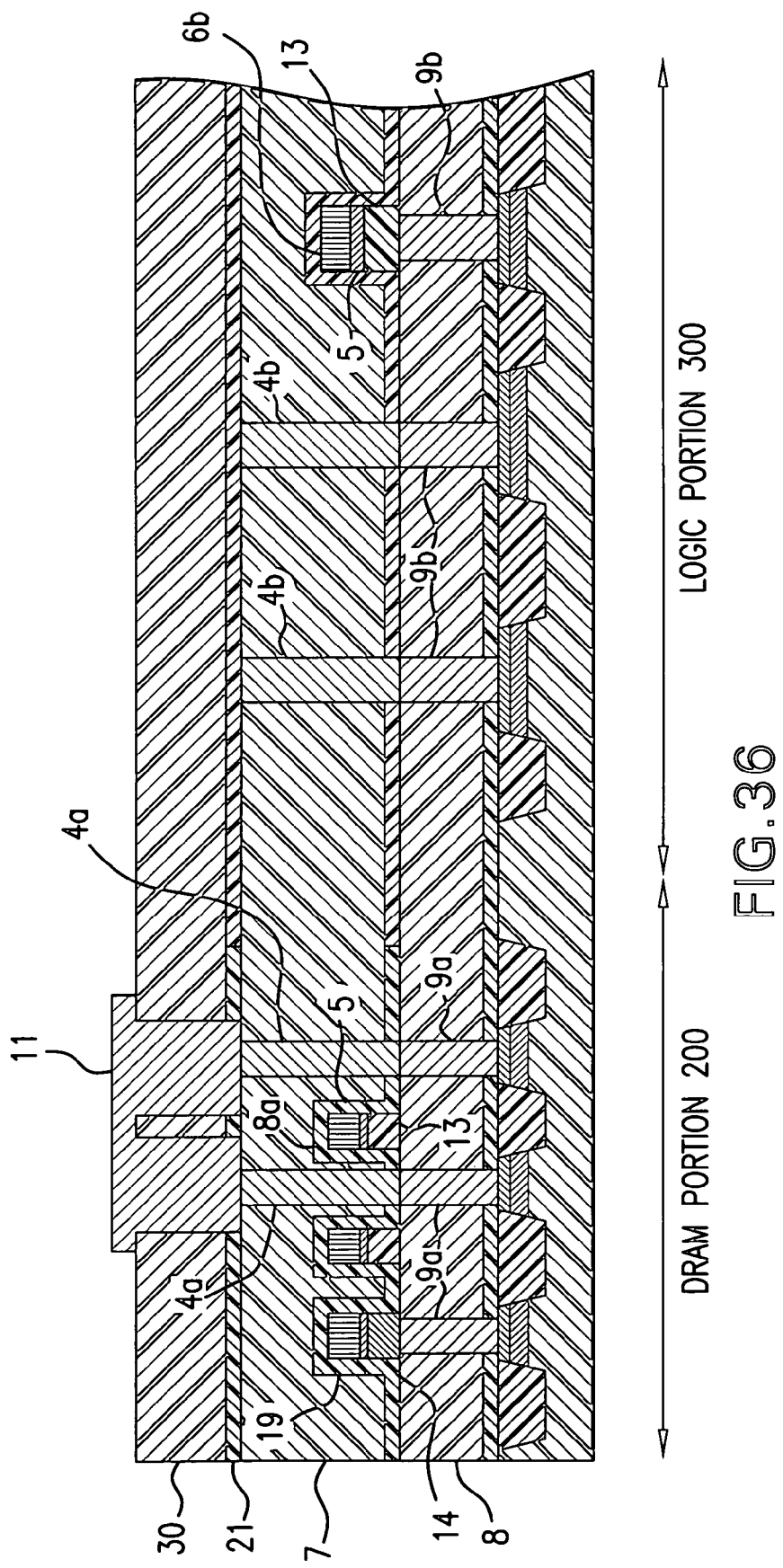
FIG. 36 is a cross sectional view of a semiconductor device typically illustrating a case where the method for manufacturing the semiconductor device of the fourth embodiment of the present invention.

Next, as shown in FIG. 36, the insulating film 21 and the interlayer film 30 are formed on the interlayer film 7. Then, the capacitor 11 for the memory cell is formed in the interlayer film 30. A lower electrode of the capacitor 11 is coupled to the contact plug 4a.

Next, as shown in FIG. 29, the interlayer film 40 is formed on the interlayer film 30. Then, the contact plugs 50, which extend through the interlayer film 30 and 40 and which are coupled to the contact plugs 4b, are formed in the Logic portion 300. Further, the interconnects 60 that are coupled to the contact plugs 50 are formed on the interlayer film 40.

According to the above-described procedure, the semiconductor device illustrated in FIG. 29 can be manufactured.

What is claimed is:

1. A semiconductor device comprising:
    a semiconductor substrate having a DRAM portion and a Logic portion;
    a first transistor formed in said DRAM portion;
    a second transistor formed in said Logic portion;
    a first insulating layer covering said DRAM portion and said Logic portion;
    a first contact plug formed in said first insulating layer to electrically contact said first transistor in said DRAM portion;
    an insulating interlayer for said DRAM portion selectively formed on one portion of said first insulating layer;
    a first bit line for said DRAM portion formed on said insulating interlayer; and
    a nitride film formed in contact with said first bit line, said insulating interlayer, and with another portion of said first insulating layer, said nitride film covering said Logic portion.

2. The semiconductor device according to claim 1, further comprising:
    a second contact plug formed in said first insulating layer in electrically contact with said second transistor in said Logic portion; and
    a second bit line for said Logic portion formed over yet another portion of said first insulating layer to electrically contact said second contact plug; and
    a second bit contact for said Logic portion between said second contact plug and said second bit line to electrically connect therebetween,
    wherein said nitride film contacts said second bit line and said second bit contact.

3. The semiconductor device according to claim 1, further comprising:
    a second insulating layer covering said nitride film;
    a third contact plug formed in said second insulating layer to electrically contact said first contact plug; and
    a capacitor formed on said second insulating layer, a lower electrode of said capacitor contacting said third contact plug.

4. The semiconductor device of claim 1, further comprising:
    a third bit line and a first bit contact, said first bit contact being between said first contact plug and said third bit line to electrically connect therebetween,
    wherein said nitride film is in contact with a top surface and a side surface of said third bit line and a side surface of said first bit contact.

* * * * *